(12) United States Patent
Kim et al.

(10) Patent No.: US 12,354,888 B2
(45) Date of Patent: Jul. 8, 2025

(54) APPARATUS FOR REMOVING BIPOLAR ELEMENT

(71) Applicant: Samsung Display Co., LTD., Yongin-si (KR)

(72) Inventors: Jin Yool Kim, Asan-si (KR); Dong Hwan Kim, Hwaseong-si (KR); Seon Beom Ji, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 345 days.

(21) Appl. No.: 18/109,307

(22) Filed: Feb. 14, 2023

(65) Prior Publication Data
US 2023/0260805 A1 Aug. 17, 2023

(30) Foreign Application Priority Data
Feb. 14, 2022 (KR) .................... 10-2022-0018747

(51) Int. Cl.
*H01L 21/67* (2006.01)
*H01L 25/16* (2023.01)

(52) U.S. Cl.
CPC .. *H01L 21/67017* (2013.01); *H01L 21/67092* (2013.01); *H01L 25/167* (2013.01)

(58) Field of Classification Search
CPC ...................... H01L 21/67017; H01L 21/6709
USPC ......................................... 156/754
See application file for complete search history.

(56) References Cited

U.S. PATENT DOCUMENTS 6,848,455 B1    2/2005  Shrinivasan et al.
11,532,492 B2 * 12/2022  Morikawa ......... H01L 21/67742

FOREIGN PATENT DOCUMENTS

KR      10-2188494      12/2020

* cited by examiner

*Primary Examiner* — James D Sells
(74) *Attorney, Agent, or Firm* — KILE PARK REED & HOUTTEMAN PLLC

(57) ABSTRACT

An apparatus for removing a bipolar element for a display module includes: a remover that removes the bipolar element; and a solvent storage that supplies solvent to the remover, wherein the remover includes: a partition wall defining a solvent channel which the solvent is injected into and discharged from; and a vibrator disposed inside the solvent channel.

20 Claims, 27 Drawing Sheets

APPARATUS FOR REMOVING BIPOLAR ELEMENT

CROSS-REFERENCE TO RELATED APPLICATION

This application claims priority to and benefits of Korean Patent Application No. 10-2022-0018747 under 35 U.S.C. § 119, filed in the Korean Intellectual Property Office on Feb. 14, 2022, the entire contents of which are incorporated herein by reference.

BACKGROUND

1. Technical Field

The disclosure relates to an apparatus for removing a bipolar element.

2. Description of Related Art

The importance of display devices as communication media has been emphasized because of the increasing development of information technology. Also, users of the display devices such as an organic light-emitting display device (OLED), and a liquid crystal display device (LCD) have been increasing and becoming more popular.

A display device includes a display panel such as an organic light-emitting display panel, a liquid crystal display panel, and the like. The light-emitting display panel may include a light-emitting element. For example, a light-emitting diode (LED) as the light-emitting element may include an organic light-emitting diode (OLED) using an organic material as a fluorescent material, and an inorganic light-emitting diode using an inorganic material as a fluorescent material.

The inorganic light-emitting diode using an inorganic semiconductor as the fluorescent materials, in contrast to the organic light-emitting diode, has durability in a high-temperature environment and has higher blue light efficiency.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide an apparatus for removing a bipolar element which is capable of selectively removing an aggregate of inorganic light-emitting diode elements on a pixel.

However, embodiments of the disclosure are not limited to those set forth herein. The above and other embodiments will become more apparent to one of ordinary skill in the art to which the disclosure given below.

According to an embodiment of the disclosure, an apparatus for removing a bipolar element for a display module, the apparatus includes: a remover for removing the bipolar element; and a solvent storage for supplying solvent to the remover. The remover may include a partition wall defining a solvent channel which the solvent is injected into and discharged from; and a vibrator disposed inside the solvent channel.

In an embodiment, a width of the solvent channel decreases as a distance from the display module decreases.

In an embodiment, the partition wall and the vibrator may be spaced apart from each other.

In an embodiment, a length of the partition wall may be greater than a length of the vibrator.

In an embodiment, the remover may move and be spaced apart from the display module.

In an embodiment, the partition wall may include a first partition wall adjacent to the solvent storage and a second partition wall adjacent to the display module. The second partition wall may have a lower rigidity than rigidity of the first partition wall.

In an embodiment, the first partition wall and the second partition wall may include different materials from each other.

In an embodiment, an end of the vibrator may not overlap an end of the second partition wall in a direction perpendicular to a length direction of each of the vibrator and the second partition wall.

In an embodiment, the solvent may be received in a vibration space defined between the end of the vibrator and the second partition wall.

In an embodiment, the solvent may be adjacent to the bipolar element, and be in contact with the vibrator.

In an embodiment, the vibrator may be an ultrasonic vibrator and vibrate the solvent received in the vibration space.

In an embodiment, the apparatus may collect the solvent into the solvent storage via the solvent channel.

In an embodiment, the solvent may be made of a liquid substance.

In an embodiment, the display module may include a plurality of bank patterns disposed on a substrate and spaced apart from each other; and an insulating layer covering the plurality of bank patterns. The second partition wall may be in direct contact with the insulating layer.

According to an embodiment of the disclosure, an apparatus for removing a bipolar element for a display module, the apparatus includes: a vibrator vibrating the display module, the display module being seated on the vibrator; a remover spaced apart from the vibrator, the display module being interposed between the remover and the vibrator; and a solvent storage that supplies solvent to the remover. The remover may include a partition wall defining a solvent channel which the solvent is injected into and discharged from.

In an embodiment, the remover may move and be spaced apart from the display module.

In an embodiment, the partition wall may include a first partition wall adjacent to the solvent storage and a second partition wall adjacent to the display module. The second partition wall may have a lower rigidity than a rigidity of the first partition wall.

In an embodiment, the display module may include a plurality of bank patterns disposed on a substrate and spaced apart from each other; and an insulating layer covering the plurality of bank patterns. The second partition wall may be in direct contact with the insulating layer.

In an embodiment, the solvent may be received in a vibration space as a space adjacent to the second partition wall. The vibrator may be an ultrasonic vibrator and vibrate the solvent received in the vibration space.

In an embodiment, the vibrator covers an entire area of the substrate.

The apparatus for removing the bipolar element according to an embodiment may selectively remove an aggregate of the inorganic light-emitting diode elements on the pixel.

Effects according to the embodiments are not limited to that as described above, and further various effects are included herein.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
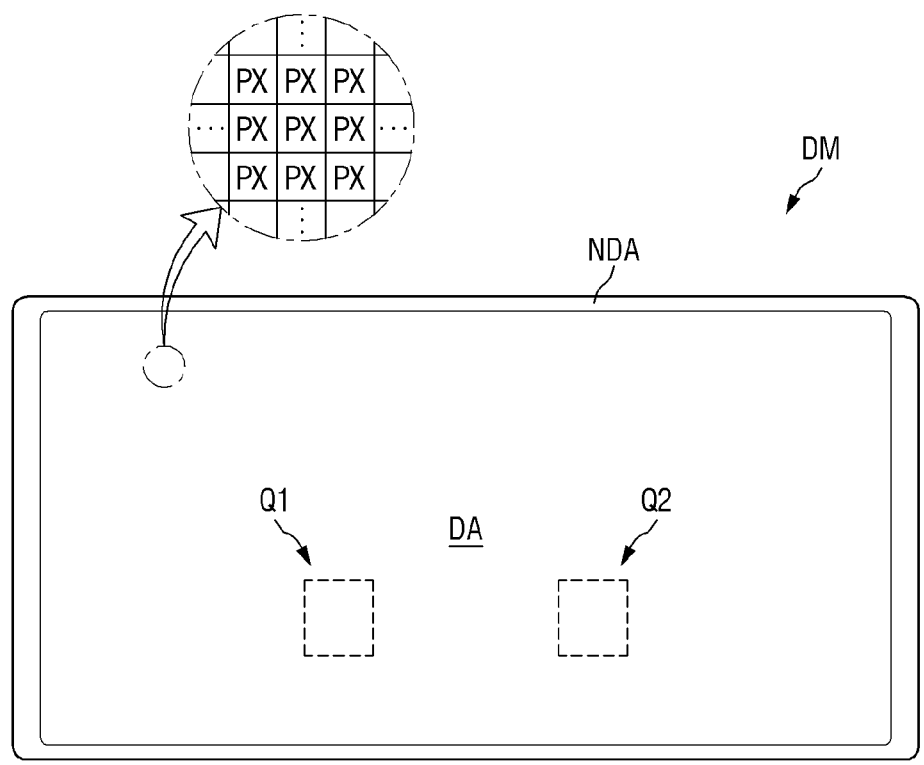
FIG. 1 is a plan view schematically showing a display module according to an embodiment.
Figure 1:
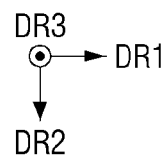

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order.

When an element, such as a layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, like reference numerals denote like elements.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure. Similarly, the second element could also be termed the first element.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Features of each of various embodiments of the disclosure may be partially or entirely combined with each other and may technically variously interwork with each other, and respective embodiments may be implemented independently of each other or may be implemented together in association with each other.

Figure 2:
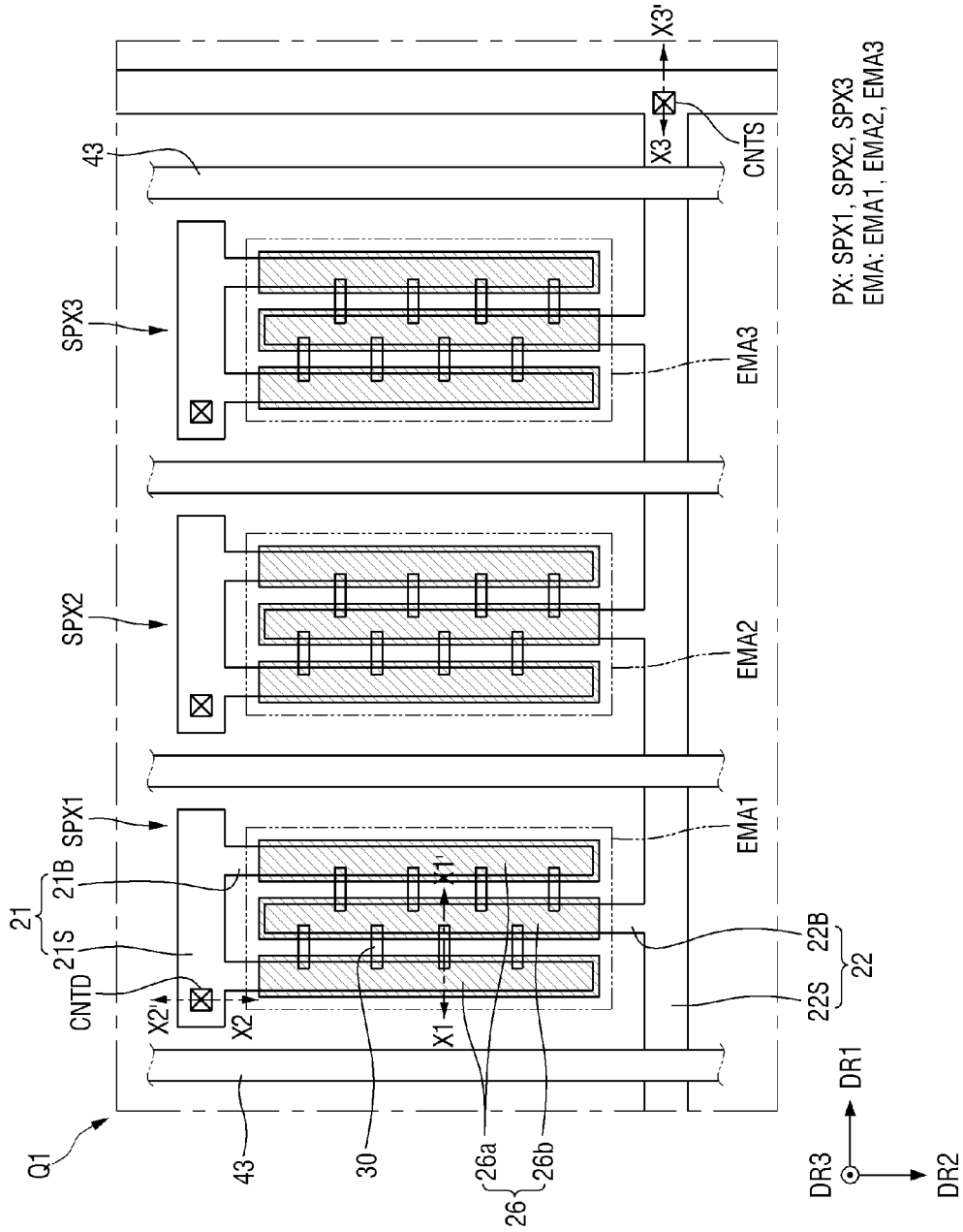
FIG. 2 is a schematic enlarged view of a Q1 area of FIG. 1.
Figure 3:
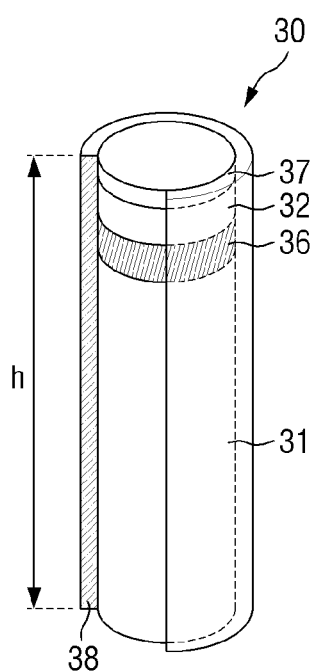
FIG. 3 is a structural diagram schematically showing a structure of a light-emitting element.
Figure 4:
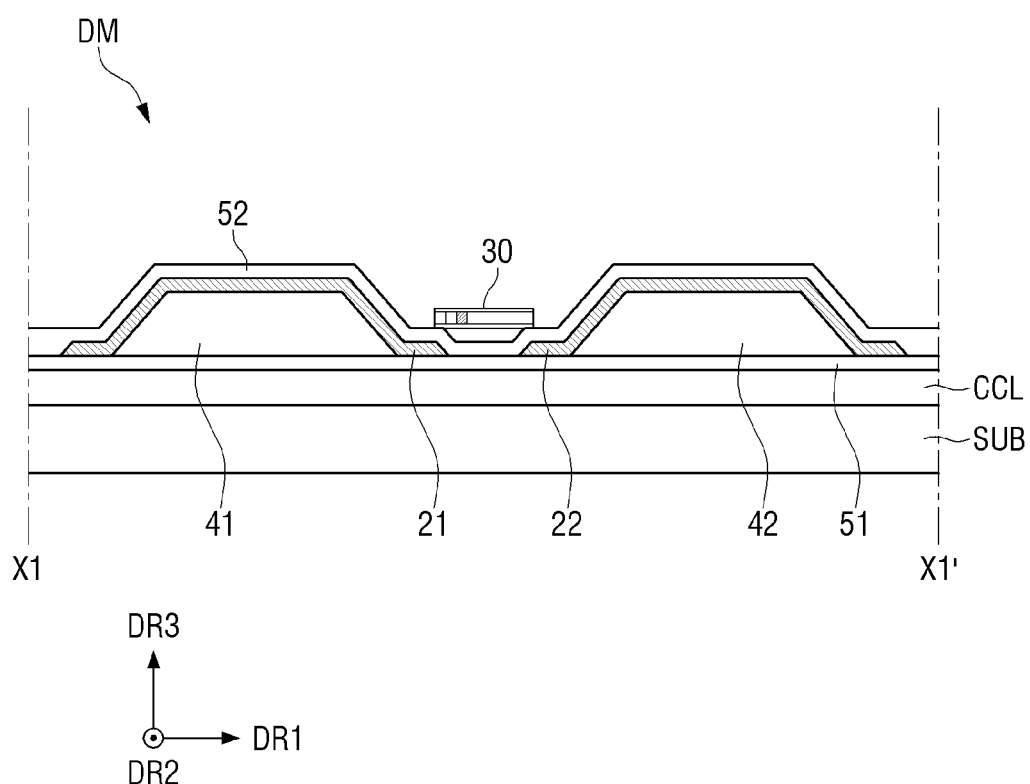
FIG. 4 is a cross-sectional view showing a schematic cross section taken along a line X1 to X1' in FIG. 2.

FIG. 1 is a plan view schematically showing a display module according to an embodiment. FIG. 2 is a schematic enlarged view of a Q1 area of FIG. 1. FIG. 3 is a structural diagram schematically showing a structure of a light-emitting element. FIG. 4 is a cross-sectional view showing a schematic cross section taken along a line X1 to X1' in FIG. 2.

In FIG. 1, a first direction DR1, a second direction DR2, and a third direction DR3 are defined. The first direction DR1 and the second direction DR2 may be perpendicular to each other. The first direction DR1 and the third direction DR3 may be perpendicular to each other. The second direction DR2 and the third direction DR3 may be perpendicular to each other. The first direction DR1 may refer to a horizontal direction in the drawing, the second direction DR2 may refer to a vertical direction in the drawing, and the third direction DR3 may refer to directions toward a top and a bottom in the drawing. In following specifications, unless otherwise specified, a direction may refer to opposite directions respectively toward both opposing sides along the direction. Further, when the opposite directions respectively toward both opposing sides along the direction are distinguished from each other, the opposite directions may include a direction toward a side and a direction toward another side. The side and the another side may be referred to a side and another side along the direction, respectively. Based on FIG. 2, a side to which an arrow point is referred to as the side, and the opposite side thereto is referred to as the another side.

Referring to FIG. 1, a display module DM according to an embodiment may be a component for implementing a display device DD (e.g., refer to FIG. 5) that displays a moving image or a still image. The display device DD may refer to any electronic device that provides a display screen. For example, the display device DD may include televisions, laptops, monitors, billboards, Internet of Things, mobile phones, smart phones, tablet PCs, electronic watches, smart watches, watch phones, head mounted displays, mobile communication terminals, electronic notebooks, electronic books, PMP (Portable Multimedia Player), navigation devices, game consoles, digital cameras, camcorders, etc. that may provide a display screen.

As used herein, the display module DM may mean an intermediate structure obtained during a process of manufacturing the display device DD. In case that an additional process is performed on the display module DM, the display module DM may be converted to the display device DD. For example, the display module DM may refer to an intermediate structure obtained by placing a light-emitting element 30 (e.g., refer to FIG. 3). After the light-emitting element 30 has been placed, a post-process may further be performed on the display module DM, and the display device DD may be manufactured. Hereinafter, for convenience of description, following description is based on a structure of the display module DM.

Figure 13:
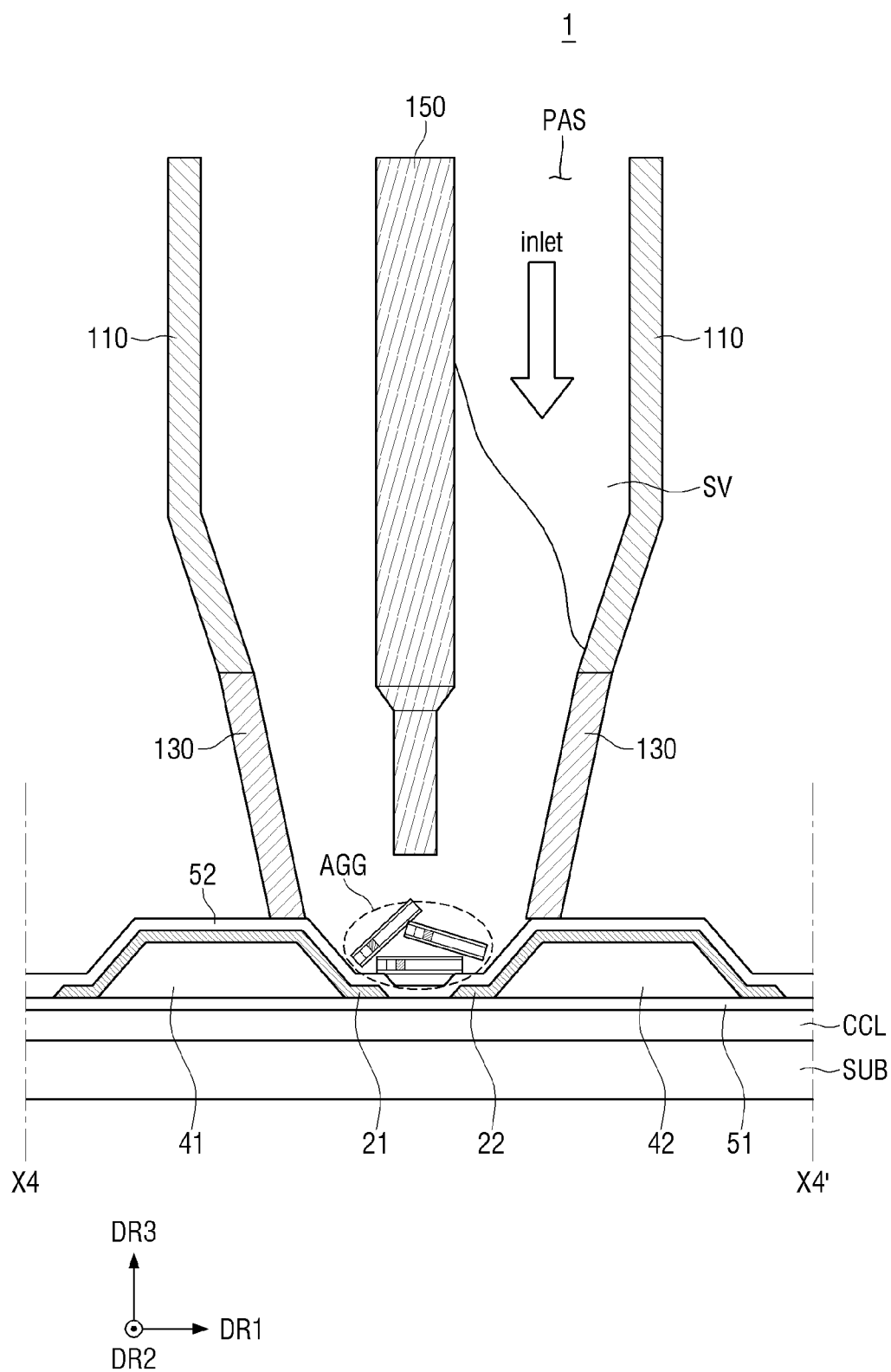
FIGS. 13 to 17 are schematic cross-sectional views of steps to illustrate a bipolar element removal process using the apparatus for removing the bipolar element of FIG. 12.

A shape of the display module DM may be variously modified. For example, the display module DM may have a rectangle having a long horizontal side, a rectangle having a long vertical side, a square, a rectangle with rounded corners, polygons, a circle, or the like. A shape of a display area DA of the display module DM may be similar to an overall shape of the display module DM. In FIG. 13, each of the display module DM and the display area DA may have a rectangular shape with a long horizontal side.

The display module DM may include the display area DA and a non-display area NDA. The display area DA may refer to an area where the screen may be displayed. The non-display area NDA may refer to an area in which the screen is not displayed. The display area DA may be referred to as an active area, and the non-display area NDA may also be referred to as a non-active area.

The display area DA may usually occupy (or be disposed in) an inner area of the display module DM. The display area DA may include pixels PX. The pixels PX may be arranged in a matrix manner. A shape of each pixel PX may be a rectangle or a square in a plan view, but is not limited thereto. In other embodiments, each of the pixels PX may have a rhombus shape with each side inclined relative to a direction. Each of the pixels PX may include at least one light-emitting element 30 (e.g., refer to FIG. 3) that emits light in a wavelength band (e.g., a specific wavelength band or selectable wavelength band) to display a color (e.g., a specific color or selectable color).

The light-emitting element 30 disposed in the pixel PX of the display module DM may be placed in the pixel PX in an inkjet printing scheme. According to characteristics of the inkjet printing scheme, the display module DM may have a normal area Q1 in which the light-emitting elements 30 are arranged side by side and are spaced apart from each other by a constant spacing and a defective area Q2 in which the light-emitting elements 30 aggregate with each other. The defective area Q2 where the light-emitting elements 30 aggregate with each other may cause disconnection or poor contact, which may cause deterioration of image quality. Thus, the aggregate of the light-emitting elements 30 should be removed, and light-emitting elements 30 may be applied. Hereinafter, in describing the structure of the display module DM, the normal area Q1 is first described, and the defective area Q2 is described below.

Referring to FIG. 2, each of the pixels PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. The first color may be blue, the second color may be green, and the third color may be red. However, the disclosure is not limited thereto. The sub-pixels SPXn (n is a natural number) may emit light of a same color. In FIG. 2, the pixel PX includes three sub-pixels SPXn. However, the disclosure is not limited thereto. The pixel PX may include a larger number of sub-pixels SPXn.

Each sub-pixel SPXn of the display module DM may include an area defined as a light-emitting area EMA. The first sub-pixel SPX1 may include a first light-emitting area EMA1, the second sub-pixel SPX2 may include a second light-emitting area EMA2, and the third sub-pixel SPX3 may include a third light-emitting area EMA2. The light-emitting area EMA may be defined as an area where the light-emitting element 30 included in the display module DM emits light of a wavelength band (e.g., a specific wavelength band or selectable wavelength band).

Although not shown in the drawing, each sub-pixel SPXn of the display module DM may include a non-light-emitting area defined as an area other than the light-emitting area EMA. The non-light-emitting area may be an area in which the light-emitting element 30 is not disposed and the light emitted from the light-emitting element 30 does not reach. Thus, the light may not be emitted from the non-light-emitting area.

Figure 15:
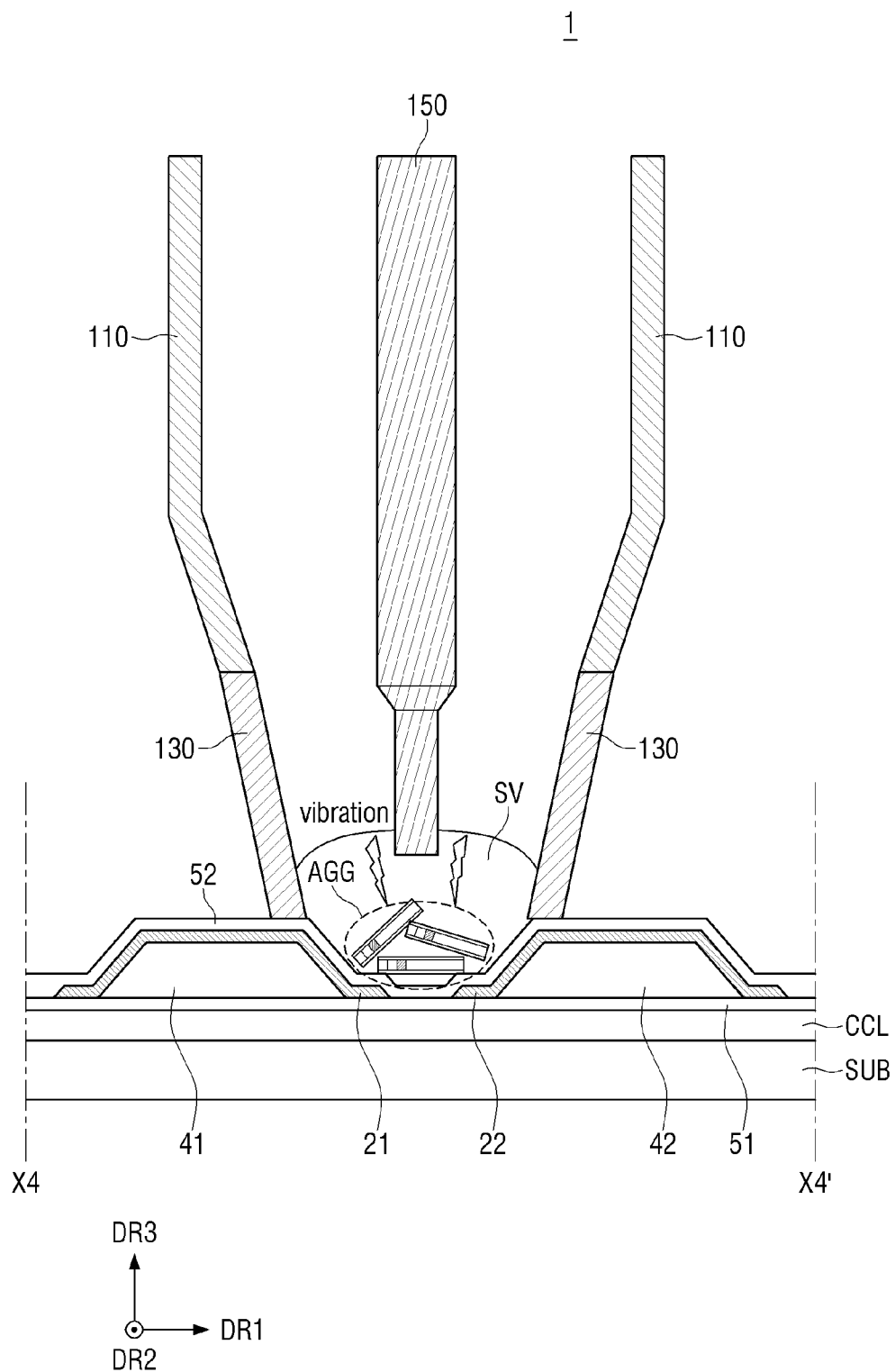

Each sub-pixel SPXn of the display module DM may include electrodes 21 and 22, a light-emitting element 30 (or the light-emitting elements 30), inner banks 41 and 42 (e.g., refer to FIG. 4) and an outer bank 43 and at least one insulating layer as shown in FIG. 15. Contact electrodes 26 may be disposed on the light-emitting element 30 after the light-emitting element 30 has been disposed in each sub-pixel SPXn. Hereinafter, the display module DM is described based on a state before the contact electrodes 26 are disposed on the light-emitting element 30. For example, a description of a display module DM, in which the contact electrodes 26 are not disposed on the light-emitting element 30, is provided below.

The electrodes 21 and 22 may be electrically connected to the light-emitting elements 30, and a voltage may be applied thereto. Thus, the light-emitting elements 30 may emit light in a wavelength band (e.g., a specific wavelength band or selectable wavelength band). Further, at least one of the electrodes 21 and 22 may be utilized to generate an electric field within the sub-pixel SPXn to align the light-emitting element 30. For example, during a manufacturing process of the display module DM, the electric field may be formed between the electrodes 21 and 22, and the light-emitting element 30 may be aligned in the sub-pixel SPXn.

The electrodes 21 and 22 may include the first electrode 21 and the second electrode 22. In an embodiment, the first electrode 21 may be a separate pixel electrode for each sub-pixel SPXn, and the second electrode 22 may be a common electrode commonly connected to the sub-pixels SPXn. One of the first electrode 21 and the second electrode 22 may be an anode electrode of the light-emitting element 30, and another thereof may be a cathode electrode of the light-emitting element 30. However, the disclosure is not limited thereto and vice versa.

The first electrode 21 and the second electrode 22 may respectively include electrode stems 21S and 22S and include at least one electrode branch 21B and 22B. The electrode stems 21S and 22S may extend in a horizontal direction. The at least one electrode branch 21B and 22B may be branched from at least one of the electrodes stems 21S and 22S and extend in a vertical direction intersecting the horizontal direction.

The first electrode 21 may include the first electrode stem 21S and at least one first electrode branch 21B. The first electrode stem 21S may extend in the horizontal direction. The at least one first electrode branch 21B may be branched from the first electrode stem 21S and extend in the vertical direction.

Each of ends (e.g., both distal ends) of the first electrode stem 21S of a pixel PX may be spaced apart from each of ends (e.g., both distal ends) of a first electrode stem 21S of a sub-pixel SPXn adjacent thereto in the horizontal direction. The distal ends of the first electrode stems 21S of the sub-pixels SPXn in a same row (e.g., sub-pixels SPXn arranged in the horizontal direction) may be aligned with each other in substantially a same straight line. Each of the both distal ends of the first electrode stem 21S of the pixel may be spaced apart from each of the both distal ends of the first electrode stem 21S of the sub-pixel adjacent thereto in the horizontal direction. Thus, different electrical signals may be applied to the first electrode branches 21B, and each of the first electrode branches 21B may operate separately.

The first electrode branch 21B may be branched from at least a portion of the first electrode stem 21S and may extend in the vertical direction. An end (e.g., a distal end) of the first electrode branch 21B may be spaced apart from the second electrode stem 22S facing the first electrode stem 21S.

The second electrode 22 may include the second electrode stem 22S and the second electrode branch 22B. The second electrode stem 22S may extend in the horizontal direction, may be spaced apart from the first electrode stem 21S in the vertical direction, and may face the second electrode stem 21. The second electrode branch 22B may branch from the second electrode stem 22S and extend in the vertical direction. The second electrode stems 22S of the sub-pixels SPXn adjacent to each other end in the horizontal direction may be electrically connected to each other. For example, unlike the first electrode stem 21S, the second electrode stem 22S may extend in the horizontal direction and may extend across the sub-pixels SPXn arranged horizontally. The second electrode stem 22S extending across the sub-pixels SPXn arranged horizontally may be electrically connected to an outer portion of the display area DA in which each pixel PX or the sub-pixels SPXn are disposed, or a portion extending in a direction from the non-display area NDA.

The second electrode branch 22B may be spaced apart from and face the first electrode branch 21B, and may be terminated and may be spaced apart from the first electrode stem 21S. The second electrode branch 22B may be electrically connected to the second electrode stem 22S, and an end of the second electrode branch 22B in the extending direction may be disposed in the sub-pixel SPXn and spaced apart from the first electrode stem 21S.

The first electrode 21 and the second electrode 22 may be electrically connected to a circuit element layer CCL of the display module DM via contact holes (e.g., a first electrode contact hole CNTD and a second electrode contact hole CNTS), respectively. In the drawing, the first electrode contact hole CNTD may be formed for each of the first electrode stem 21S of each sub-pixel SPXn, and the second electrode contact hole CNTS may be formed in the second electrode stem 22S horizontally extending across the sub-pixels SPXn arranged in the horizontal direction. However, the disclosure is not limited thereto. In other embodiments, the second electrode contact hole CNTS may be formed for each sub-pixel SPXn.

The outer bank 43 may be disposed at a boundary between the sub-pixels SPXn (e.g., adjacent ones of the sub-pixels SPXn). The inner banks 41 and 42 may be disposed adjacent to a central portion of each sub-pixel SPXn and respectively disposed under the electrodes 21 and 22. Although the inner banks 41 and 42 are not shown in the drawing, the first inner bank 41 and the second inner bank 42 may be disposed under the first electrode branch 21B and the second electrode branch 22B, respectively.

The outer bank 43 may be placed at a boundary between the sub-pixels SPXn. Each of the first electrode stems 21S may be terminated to have an end (e.g., a distal end) spaced apart from the outer bank 43. The outer bank 43 may extend in the vertical direction and may be disposed at the boundary between the sub-pixels SPXn arranged in the horizontal direction. However, the disclosure is not limited thereto, and the outer bank 43 may extend in the horizontal direction and may also be disposed at a boundary between the sub-pixels SPXn arranged in the vertical direction. The inner banks 41 and 42, and the outer bank 43 may include a same material. Thus, the outer bank 43 and the inner banks 41 and 42 may be formed simultaneously in a process (e.g., in a same process).

The light-emitting element 30 may be disposed between the first electrode 21 and the second electrode 22. An end of the light-emitting element 30 may be electrically connected to the first electrode 21 and another end thereof may be electrically connected to the second electrode 22. The light-emitting element 30 may be electrically connected to each of the first electrode 21 and the second electrode 22 via a contact electrode 26. Description of the contact electrode 26 is provided below.

The light-emitting elements 30 may be arranged to be spaced apart from each other and may be aligned with each other in a direction (e.g., in substantially parallel to each other). A spacing between the adjacent light-emitting elements 30 is not limited thereto. In other embodiments, some of the light-emitting elements 30 may be arranged adjacent to each other to constitute a group. Some of the light-emitting elements 30 may be spaced apart from each other by a constant spacing (e.g., a predetermined or selectable constant spacing) and may have non-uniform arrangement density. Some of the light-emitting elements 30 may be aligned and oriented with each other in a direction. In an embodiment, the light-emitting element 30 may have a shape extending in the direction such that a direction in which each of the electrodes (e.g., each of the first electrode branch 21B and the second electrode branch 22B) extends, may be substantially perpendicular to the direction in which the light-emitting element 30 extends. However, the disclosure is not limited thereto, and the direction, in which each of the first electrode branch 21B and the second electrode branch 22B extends, may be inclined relative to the direction in which the light-emitting element 30 extends.

The light-emitting element 30 may be a light-emitting diode. For example, the light-emitting element 30 may be an inorganic light-emitting diode having a size of a nanometer scale to a micrometer scale and made of an inorganic material. The inorganic light-emitting diodes may be disposed between the two electrodes facing each other and may be aligned with each other under an electric field generated in a direction between the two electrodes. The light-emitting elements 30 may be disposed between the electrodes and may be aligned with each other under the electric field generated between the two electrodes.

The light-emitting element 30 according to an embodiment may have a shape extending in a direction. The light-emitting element 30 may have a shape such as a rod, a wire, or a tube. In an embodiment, the light-emitting element 30 may be cylindrical or rod-shaped. However, the shape of the light-emitting element 30 is not limited thereto, and may have a shape of a polygonal prism such as a cube, a cuboid, or a hexagonal prism. In other embodiments, the light-emitting element 30 may have a shape which extends in a direction but has a partially inclined outer face. Semiconductors included in the light-emitting element 30 may be sequentially arranged in the direction or may have a stack structure. Description of the semiconductors included in the light-emitting element 30 is provided below. In the claims, the light-emitting element may be referred to as a bipolar element.

The light-emitting element 30 may include a semiconductor layer doped with any conductivity type (e.g., p-type or n-type impurities). The semiconductor layer may emit light in a wavelength band (e.g., a specific wavelength band or selectable wavelength band) upon receiving an electrical signal applied from an external power source.

Referring to FIG. 3, the light-emitting element 30 may include a first semiconductor layer 31, a second semiconductor layer 32, an active layer 36, an electrode layer 37, and an insulating film 38.

The first semiconductor layer 31 may be made of an n-type semiconductor. In an embodiment, when the light-emitting element 30 emits light in a blue wavelength band, the first semiconductor layer 31 may include a semiconductor material of chemical formula $Al_xGa_yIn_{1-x-y}N$ ($0 \leq x \leq 1$, $0 \leq y \leq 1$, $0 \leq x+y \leq 1$). For example, the first semiconductor layer 31 may include at least one of AlGaInN, GaN, AlGaN, InGaN, AlN, and InN doped with n-type impurities. The first semiconductor layer 31 may be doped with an n-type dopant. In an embodiment, the n-type dopant of the first semiconductor layer 31 may be Si, Ge, Sn, or the like. In an embodiment, the first semiconductor layer 31 may be made of n-GaN doped with n-type Si. A length of the first semiconductor layer 31 may be in a range from about 1.5 μm to about 5 μm. However, the disclosure is not limited thereto.

The second semiconductor layer 32 may be disposed on the active layer 36. Description of the active layer 36 is provided below. The second semiconductor layer 32 may be made of a p-type semiconductor. In an embodiment, when the light-emitting element 30 emits light in a blue or green wavelength band, the second semiconductor layer 32 may include a semiconductor material with a chemical formula of $Al_xGa_yIn_{1-x-y}N$ ($0 \leq x \leq 1$, $0 \leq y \leq 1$ and $0 \leq x+y \leq 1$). For example, the second semiconductor layer 32 may include at least one of AlGaInN, GaN, AlGaN, InGaN, AlN, and InN doped with p-type impurities. The second semiconductor layer 32 may be doped with a p-type dopant. In an embodiment, the p-type dopant of the second semiconductor layer 32 may be Mg, Zn, Ca, Se, Ba, or the like. In an embodiment, the second semiconductor layer 32 may be made of p-GaN doped with p-type Mg. A length of the second semiconductor layer 32 may in a range from about 0.05 μm to about 0.10 μm. However, the disclosure is not limited thereto.

The active layer 36 may be disposed between the first semiconductor layer 31 and the second semiconductor layer 32. The active layer 36 may include a material of a single or multiple quantum well structure. When the active layer 36 includes a material of the multiple quantum well structure, quantum layers and well layers may be alternately stacked each other. The active layer 36 may emit light when electrons and holes are combined with each other therein based on an electrical signal applied thereto through the first semiconductor layer 31 and the second semiconductor layer 32. In an embodiment, when the active layer 36 emits light in a blue wavelength band, the active layer 36 may include a material such as AlGaN or AlGaInN. For example, when the active layer 36 has the multiple quantum well structure in which the quantum layers and the well layers are alternately stacked each other, each of the quantum layers may include a material such as AlGaN or AlGaInN, and each of the well layers may include a material such as GaN or AlInN. In an embodiment, the active layer 36 may include AlGaInN as a material of the quantum layer and AlInN as a material of the well layer, as described above. The active layer 36 may emit blue light having a central wavelength band in a range of about 450 nm to about 495 nm. However, the disclosure is not limited thereto. For example, the active layer 35 may include group III to V semiconductor materials based on a wavelength band of the emitted light. Thus, the active layer 35 may emit light in a red or green wavelength band. A length of the active layer 36 may be in a range of about 0.05 μm to about 0.10 μm. However, the disclosure is not limited thereto.

In an embodiment, the light emitted from the active layer 36 may be emitted not only toward a lengthwise outer surface of the light-emitting element 30, but also toward both opposing side faces. Directionality of the light emitted from the active layer 36 is not limited to a direction. For example, the active layer 36 may emit the light in various directions.

The electrode layer 37 may be an Ohmic contact electrode. However, the disclosure is not limited thereto, and the layer 37 may be a Schottky contact electrode. The light-emitting element 30 may include at least one electrode layer 37. In FIG. 3, the light-emitting element 30 includes a single electrode layer 37. However, the disclosure is not limited thereto. In other embodiments, the light-emitting element 30 may include a greater number of electrode layers 37. In an embodiment, the layer 37 may be omitted. Description of the light-emitting element 30 is provided below. The description of the light-emitting element 30 may be applied to a light-emitting element 30 having various number of the electrode layers 37 or another component.

The electrode layer 37 may reduce resistance between the light-emitting element 30 and the electrode (or the contact electrode) when the light-emitting element 30 is electrically connected to the electrode (or the contact electrode) in the display module DM according to an embodiment. The electrode layer 37 may include a conductive metal or metal oxide. For example, the electrode layer 37 may include at least one of aluminum (Al), titanium (Ti), indium (In), gold (Au), silver (Ag), ITO (Indium Tin Oxide), IZO (Indium Zinc Oxide), and ITZO (Indium Tin-Zinc Oxide). Further, the electrode layer 37 may include an n-type or p-type dopant doped semiconductor material. The electrode layers 37 may include a same material, or may include different materials. The disclosure is not limited thereto.

The insulating film 38 may be adjacent to (e.g., may surround) an outer face of each of the semiconductor layers and the electrode layers as described above. In the embodiment, the insulating film 38 may be adjacent to (e.g., may surround) the outer face of the at least active layer 36, and may extend in the direction in which the light-emitting element 30 extends. The insulating film 38 may protect the members (e.g., the first semiconductor layer 31, the second semiconductor layer 32, the active layer 36, and the electrode layer 37). In an embodiment, the insulating film 38 may be adjacent to (e.g., may surround) side faces of the members such that ends (e.g., both opposing ends) in the length direction of the light-emitting element 30 may be exposed.

In FIG. 3, the insulating film 38 may extend in the length direction of the light-emitting element 30 and cover the first semiconductor layer 31 and the side face of the electrode layer 37. However, the disclosure is not limited thereto. The insulating film 38 may cover only the outer face of some of the semiconductor layers including the active layer 36 or cover only a portion of the outer face of electrode layer 37. Thus, an outer face of each of the electrode layers 37 may be partially exposed. Further, the insulating film 38 may have a round top face in a cross section in an area adjacent to at least one end of the light-emitting element 30.

A thickness of the insulating film 38 may be in a range of about 10 nm to about 1.0 µm. However, the disclosure is not limited thereto. For example, the thickness of the insulating film 38 may be about 40 nm.

The insulating film 38 may be made of an insulating material including at least one of silicon oxide ($SiO_x$), silicon nitride ($SiN_x$), silicon oxynitride ($SiO_xN_y$), aluminum nitride (AlN), and aluminum oxide ($Al_2O_3$). However, the disclosure is not limited thereto. The film 38 may prevent an electrical short circuit that may occur when the active layer 36 is in direct contact with an electrode through which an electrical signal is transmitted to the light-emitting element 30. Further, since the insulating film 38 protects the outer surface of the light-emitting element 30 including the active layer 36, the insulating film 38 may prevent deterioration of the light-emitting efficiency.

Further, in some embodiments, the outer face of the insulating film 38 may be surface-treated. The light-emitting elements 30 may be sprayed onto the electrode in a state of being dispersed in predefined ink 90 during manufacturing of the display module DM and may be aligned with each other. In this regard, in order that the light-emitting elements 30 are maintained in the dispersed state and are not aggregated with each other in the ink 90, a surface of the insulating film 38 may be treated to have hydrophobicity or hydrophilicity.

The light-emitting element 30 may have a length h in a range of about 1 µm to about 10 µm. For example, the light-emitting element 30 may have a length h in a range of about 2 µm to about 6 µm. For example, the light-emitting element 30 may have a length in a range of about 3 µm to about 5 µm. Further, a diameter of the light-emitting element 30 may be in a range of about 30 nm to about 700 nm, and an aspect ratio of the light-emitting element 30 may be in a range of about 1.2 to about 100. However, the disclosure is not limited thereto. The light-emitting elements 30 included in the display module DM may have a diameter varying according to a variation in a composition of the active layer 36. For example, the diameter of the light-emitting element 30 may have about 500 nm.

The light-emitting element 30 according to an embodiment may include an active layer 36 including a material varying so as to emit light of a varying wavelength band to an outside. In the display module DM, a light-emitting element 30 of the first sub-pixel SPX1 may emit first light with the first wavelength in a center wavelength band thereof. A light-emitting element 30 of the second sub-pixel SPX2 may emit second light with the second wavelength in a center wavelength band thereof. A light-emitting element 30 of the third sub-pixel SPX3 may emit third light having a third wavelength in a central wavelength band thereof. Accordingly, the first light may be emitted from the first sub-pixel SPX1, the second light may be emitted from the second sub-pixel SPX2, and the third light may be emitted from the third sub-pixel SPX3. In some embodiments, the first light may be blue light having a central wavelength band in a range of about 450 nm to about 495 nm. The second light may be green light with a central wavelength band ranging from about 495 nm to about 570 nm. The third light may be red light having a central wavelength band ranging from 6 about 20 nm to about 750 nm. However, the disclosure is not limited thereto.

In FIG. 4, only a cross section of the first sub-pixel SPX1 is illustrated. However, a structure of FIG. 4 may be equally applied to another pixel PX or sub-pixel SPXn. FIG. 4 shows a schematic cross-section view extending from an end to another end of the light-emitting element 30 placed in the first sub-pixel SPX1.

Referring to FIGS. 2 and 4, the display module DM may include a first insulating layer 51, and the electrodes 21 and 22, and the light-emitting element 30 disposed on the first insulating layer 51. A circuit element layer CCL may be disposed under the first insulating layer 51, and a substrate SUB may be disposed under the circuit element layer CCL.

The substrate SUB may serve as a base of the display module DM. When the substrate SUB has flexibility, the substrate SUB may include a flexible material such as polyimide, etc. When the substrate has rigidity, the substrate SUB may be made of glass or quartz. However, the disclosure is not limited thereto.

The circuit element layer CCL may be disposed on the substrate SUB. The circuit element layer CCL may include semiconductor layers and conductive patterns. Thus, the circuit element layer CCL may include at least one transistor and a power line. The semiconductor layers and the conductive patterns of the circuit element layer CCL may be electrically connected to the electrodes 21 and 22 on the first insulating layer 51. However, detailed description of the same constituent elements is omitted.

The first insulating layer 51 may be disposed on the circuit element layer CCL. The first insulating layer 51 may partially insulate the circuit element layer CCL and the electrodes 21 and 22 from each other. The first insulating layer 51 may include an organic insulating material and planarize a surface of the elements (e.g., the circuit element layer CCL). The inner banks 41 and 42, the outer bank 43, the electrodes 21 and 22, and the light-emitting element 30 may be disposed on the first insulating layer 51.

In case that an inkjet printing device is used to spray the ink 90 (e.g., refer to FIG. 19) in which the light-emitting elements 30 are dispersed during the manufacturing of the display module DM, the outer bank 43 may prevent the ink 90 from overflowing a boundary between adjacent sub-pixels SPXn. The outer bank 43 may physically separate light-emitting elements 30 of different sub-pixels SPXn from each other. Thus, inks 90 of the different sub-pixels SPXn may not mix with each other. However, the disclosure is not limited thereto.

The inner banks 41 and 42 may include a first inner bank 41 and a second inner bank 42 disposed adjacent to a center of each sub-pixel SPXn.

The first inner bank 41 and the second inner bank 42 may be spaced apart from each other and face each other. The first electrode 21 may be disposed on the first inner bank 41, and the second electrode 22 may be disposed on the second inner bank 42. Referring to FIGS. 2 and 4, the first electrode branch 21B may be disposed on the first inner bank 41, and the second electrode branch 22B may be disposed on the second inner bank 42.

The first inner bank 41 and the second inner bank 42 may extend in the vertical direction and may be disposed within each sub-pixel SPXn. However, the disclosure is not limited thereto, and the first inner bank 41 and the second inner bank 42 may be disposed in each sub-pixel SPXn and constitute a pattern formed on an entire face of the display module DM. Each of the inner banks 41, 42 and the outer bank 43 may include polyimide (PI). However, the disclosure is not limited thereto.

Each of the first inner bank 41 and the second inner bank 42 may have a structure in which at least a portion thereof protrudes from the first insulating layer 51. Each of the first inner bank 41 and the second inner bank 42 may protrude upwardly from a plane (e.g., the upper surface of the first insulating layer 51) in which the light-emitting element 30 is disposed. At least a portion of the protruding portion (e.g., the first inner bank 41 and the second inner bank 42) may have an inclination. Since each of the inner banks 41 and 42 protrudes from the first insulating layer 51 and has an inclined side face, light emitted from the light-emitting element 30 may be reflected from the inclined side faces of the inner banks 41 and 42. As will be described below, in case that each of the electrodes 21 and 22 disposed on the inner banks 41 and 42 includes a material with high reflectivity, the light emitted from light-emitting element 30 may be reflected from the electrodes 21 and 22 and may travel (or be guided) upwardly of the first insulating layer 51.

The outer bank 43 may be disposed at the boundary between the sub-pixels SPXn so as to constitute a grid pattern, and each of the inner banks 41 and 42 may be disposed within each sub-pixel SPXn and have a shape extending in a direction.

The electrodes 21 and 22 may be disposed on the first insulating layer 51 and the inner banks 41 and 42, and the first and second electrodes 21 and 22 may be disposed on the first and second inner banks 41 and 42, respectively. As described above, the electrodes 21 and 22 may include the electrode stems 21S and 22S and the electrode branches 21B and 22B, respectively. For example, the first electrode 21 may include the first electrode stem 21S and the first electrode branch 21B, and the second electrode 22 may include the second electrode stem 22S and the second electrode branch 22B.

A partial area of each of the first electrode 21 and the second electrode 22 may be disposed on the first insulating layer 51, and partial areas of the first electrode 21 and the second electrode 22 may be respectively disposed on the first inner bank 41 and the second inner bank 42. As described above, the first electrode stem 21S of the first electrode 21 and the second electrode stem 22S of the second electrode 22 may extend in the horizontal direction. The first inner bank 41 and the second inner bank 42 may extend in the vertical direction and may extend across the sub-pixels SPXn arranged in the vertical direction.

The first electrode contact hole CNTD may pass through the first insulating layer 51 and expose a portion of the circuit element layer CCL. The first electrode contact hole CNTD may be formed in the first electrode stem 21S of the first electrode 21. The first electrode 21 may be electrically connected to a transistor of the circuit element layer CCL via the first electrode contact hole CNTD. The first electrode 21 may receive an electrical signal from the transistor.

The second electrode stem 22S of the second electrode 22 may extend in a direction so as to be disposed in a non-light-emitting area where the light-emitting elements 30 are not disposed. The second electrode contact hole CNTS may pass through the first insulating layer 51 and expose a portion of the circuit element layer CCL. The second electrode contact hole CNTS may be formed in the second electrode stem 22S. The second electrode 22 may be electrically connected to a power electrode via the second electrode contact hole CNTS. The second electrode 22 may receive an electrical signal from the power electrode.

Partial areas of the first electrode 21 and the second electrode 22 (e.g., the first electrode branch 21B and the second electrode branch 22B) may be disposed on the first inner bank 41 and the second inner bank 42, respectively. Light-emitting elements 30 may be disposed in an area between the first electrode 21 and the second electrode 22. For example, the light-emitting elements 30 may be disposed in a space between the first electrode branch 21B and the second electrode branch 22B, which face each other.

Each of the electrodes 21 and 22 may include a transparent conductive material. In an embodiment, each of the electrodes 21 and 22 may include at least one material of indium tin oxide (ITO), indium zinc oxide (IZO), and indium tin-zinc oxide (ITZO). However, the disclosure is not limited thereto. In some embodiments, each of the electrodes 21 and 22 may include a conductive material having high reflectivity. For example, each of the electrodes 21 and 22 may include metals such as silver (Ag), copper (Cu), aluminum (Al), etc. as a material with high reflectivity. Each of the electrodes 21 and 22 may include an alloy of the above-described metals. However, the disclosure is not limited thereto. The light incident to each of the electrodes 21 and 22 may be reflected therefrom and may be emitted upwardly of each sub-pixel SPXn.

Further, each of the electrodes 21 and 22 may has a structure in which at least one layer made of a transparent conductive material and at least one layer made of a metal having high reflectance are stacked each other. In other embodiments, each of the electrodes 21 and 22 may be formed as a single layer including the transparent conductive material and/or the metal having high reflectance. In an embodiment, each of the electrodes 21 and 22 may have a stacked structure of ITO/silver (Ag)/ITO/IZO, or may be made of an alloy including at least one of aluminum (Al), nickel (Ni), lanthanum (La), and the like. However, the disclosure is not limited thereto.

The second insulating layer 52 may be disposed on the first insulating layer 51, the first electrode 21, and the second electrode 22. The second insulating layer 52 may partially cover the first electrode 21 and the second electrode 22. The second insulating layer 52 may cover a substantial portion of a top face of each of the first electrode 21 and the second electrode 22 and expose a portion of each of the first electrode 21 and the second electrode 22. The second insulating layer 52 may be disposed on the first insulating layer 51 such that a portion of the top face of each of the first electrode 21 and the second electrode 22 may be exposed. For example, a portion of the top face of the first electrode branch 21B disposed on the first inner bank 41 and a portion of the top face of the second electrode branch 22B disposed on the second inner bank 42 may be exposed by openings of the second insulating layer 52. For example, the second insulating layer 52 may be formed on substantially an entire face of the first insulating layer 51 and may include an opening (or openings) partially exposing the first electrode 21 and the second electrode 22.

The second insulating layer 52 may protect the first electrode 21 and the second electrode 22 and electrically insulate the first electrode 21 and the second electrode 22 from each other. Further, the second insulating layer 52 may prevent the light-emitting element 30 disposed on the second insulating layer 52 from being damaged due to direct contact with other members. However, a shape and a structure of the second insulating layer 52 are not limited thereto.

The light-emitting element 30 may be disposed on the second insulating layer 52 and between the electrodes 21 and 22. For example, at least one light-emitting element 30 may be disposed on the second insulating layer 52 and disposed between the electrode branches 21B and 22B. However, the disclosure is not limited thereto. Although not shown in the drawings, at least some of the light-emitting elements 30 disposed in each sub-pixel SPXn may be disposed in an area other than the area between the electrode branches 21B and 22B. The light-emitting element 30 may be disposed on an end of the first electrode branch 21B and an end of the second electrode branch 22B facing each other, and may be electrically connected to each of the electrodes 21 and 22 via the contact electrode 26.

The layers (e.g., the first semiconductor layer 31, the second semiconductor layer 32, the active layer 36, and the electrode layer 37) of the light-emitting element 30 may be arranged in a horizontal direction parallel to the first insulating layer 51. The light-emitting element 30 of the display module DM according to an embodiment may have a shape extending in a direction, and may have a structure in which the semiconductor layers of the light-emitting element 30 are sequentially arranged in the direction. As described above, the light-emitting element 30 may have a structure in which the first semiconductor layer 31, the active layer 36, the second semiconductor layer 32, and the electrode layer 37 are sequentially arranged along the direction, and the insulating film 38 may be adjacent to (e.g., may surround) the outer faces thereof. The light-emitting element 30 disposed in the display module DM may extend in the direction parallel to the first insulating layer 51. The semiconductor layers included in the light-emitting element 30 may be sequentially arranged in the direction parallel to a top face of the first insulating layer 51. However, the disclosure is not limited thereto.

After the light-emitting element 30 has been disposed, a process of placing the contact electrodes 26 on the light-emitting element 30 may be performed to manufacture the display device DD. For example, the second insulating layer of the display module DM may be partially etched to expose the electrodes 21 and 22 on the bank patterns 41 and 42. The third insulating layer 53 may be placed on the light-emitting element 30, and the contact electrode 26 electrically connected to the electrodes 21 and 22 may be placed on the light-emitting element 30, the electrodes 21 and 22, and the third insulating layer 53. A passivation layer 55 may be placed on the contact electrode 26. Thus, the display device DD may be manufactured. Hereinafter, a relationship between the contact electrode 26 and the light-emitting element 30 is described in conjunction with FIG. 5 schematically showing a cross section of the display device DD.

Figure 5:
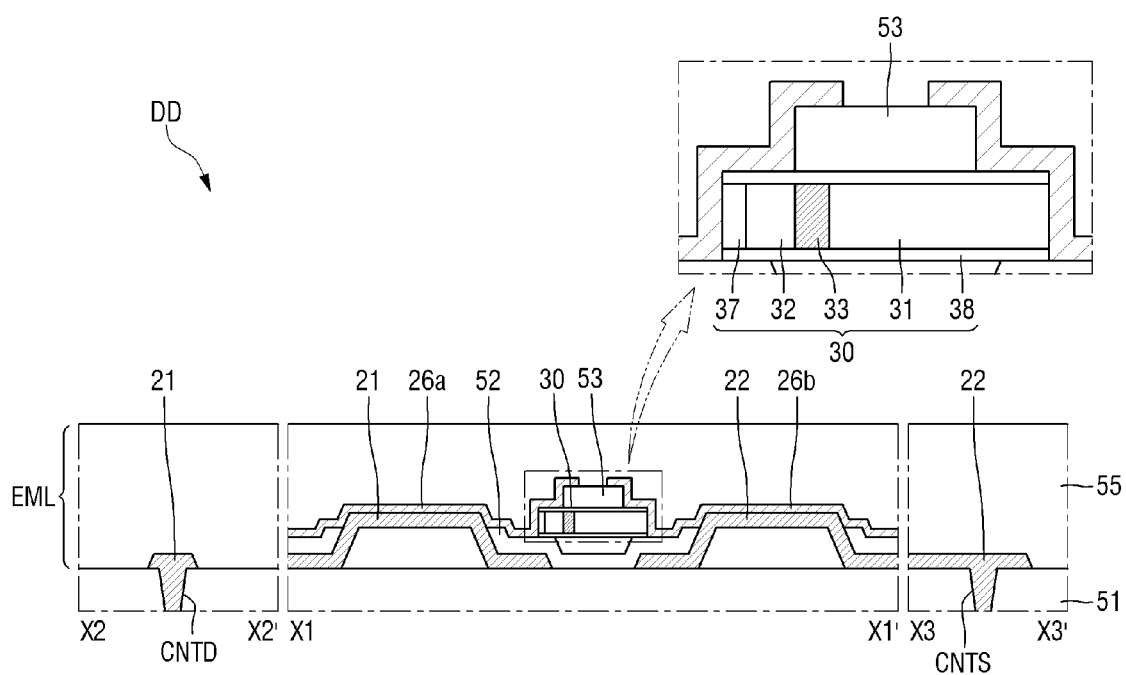
FIG. 5 is a cross-sectional view showing a schematic cross-section of a display device according to an embodiment.

FIG. 5 is a cross-sectional view showing a schematic cross-section of a display device according to an embodiment. For example, the display device DD may include the contact electrode 26, the third insulating layer 53, and the passivation layer 55 of the display module DM. FIG. 5 schematically shows a cross-section corresponding to a cross-section cut along lines X1-X1', X2-X2', and X3-X3' in FIG. 2.

Referring to FIGS. 2 and 5, in the display device DD, the end of the light-emitting element 30 may contact a first contact electrode 26a, and the another end thereof may contact a second contact electrode 26b. According to an embodiment, the insulating film 38 is not formed on a face of the end in the extension direction of the light-emitting element 30. Thus, the face of the end in the extension direction of the light-emitting element 30 may be exposed, and the first contact electrode 26a and the second contact electrode 26b may contact the exposed face of the end in the extension direction of the light-emitting element 30. Description of the first contact electrode 26a and the second contact electrode 26b is provided below. However, the disclosure is not limited thereto.

The third insulating layer 53 may be partially disposed on the light-emitting element 30 and between the first electrode 21 and the second electrode 22. The third insulating layer 53 may partially cover the outer face of the light-emitting element 30. The third insulating layer 53 may protect the light-emitting element 30 and fix (or hold) the light-emitting element 30 in the manufacturing process of the display module DM.

The third insulating layer 53 may extend in the vertical direction and may be disposed between the first electrode branch 21B and the second electrode branch 22B in a plan view. In an embodiment, the third insulating layer 53 may have an island shape or a linear shape in a plan view and may be disposed on the first insulating layer 51. According to an embodiment, the third insulating layer 53 may be disposed on a top face of the light-emitting element 30.

The first contact electrode 26a and the second contact electrode 26b may be disposed on the electrodes 21 and 22, respectively, and disposed on the third insulating layer 53. Portions of the first contact electrode 26a and the second contact electrode 26b disposed on the third insulating layer 53 may be spaced apart from each other. The third insulating layer 53 may electrically insulate the first contact electrode 26a and the second contact electrode 26b from each other such that the first contact electrode 26a and the second contact electrode 26b may not directly contact each other.

The first contact electrode 26a may contact the exposed partial area of the first electrode 21 and may be disposed on the first inner bank 41. The second contact electrode 26b may contact the exposed partial area of the second electrode 22 and may be disposed on the second inner bank 42. Each of the first contact electrode 26a and the second contact electrode 26b may transmit an electrical signal transmitted from each of the electrodes 21 and 22 to the light-emitting element 30.

The contact electrode 26 may include a conductive material. For example, the contact electrode 26 may include at least one of ITO, IZO, ITZO, aluminum (Al), etc. However, the disclosure is not limited thereto.

The passivation layer 55 may be disposed on the contact electrode 26 and the third insulating layer 53. The passivation layer 55 may protect the members disposed on the first insulating layer 51 from an external environment.

In an embodiment, each of the second insulating layer 52, the third insulating layer 53, and the passivation layer 55 as described above may include an inorganic insulating material or an organic insulating material. In an embodiment, each of the second insulating layer 52, the third insulating layer 53, and the passivation layer 55 may include an inorganic insulating material including at least one of silicon oxide ($SiO_x$), silicon nitride ($SiN_x$), silicon oxynitride ($SiO_xN_y$), aluminum oxide ($Al_2O_3$), aluminum nitride (AlN), and the like. In other embodiments, each of the second insulating layer 52, the third insulating layer 53, and the passivation layer 55 may include an organic insulating material including at least one of acrylic resin, epoxy resin, phenol resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, polymethyl methacrylate-polycarbonate synthetic resin, etc. However, the disclosure is not limited thereto.

Hereinafter, the defective area Q2 in which the light-emitting elements 30 are aggregated with each other is described below in detail in conjunction with FIGS. 6 to 8.

Figure 6:
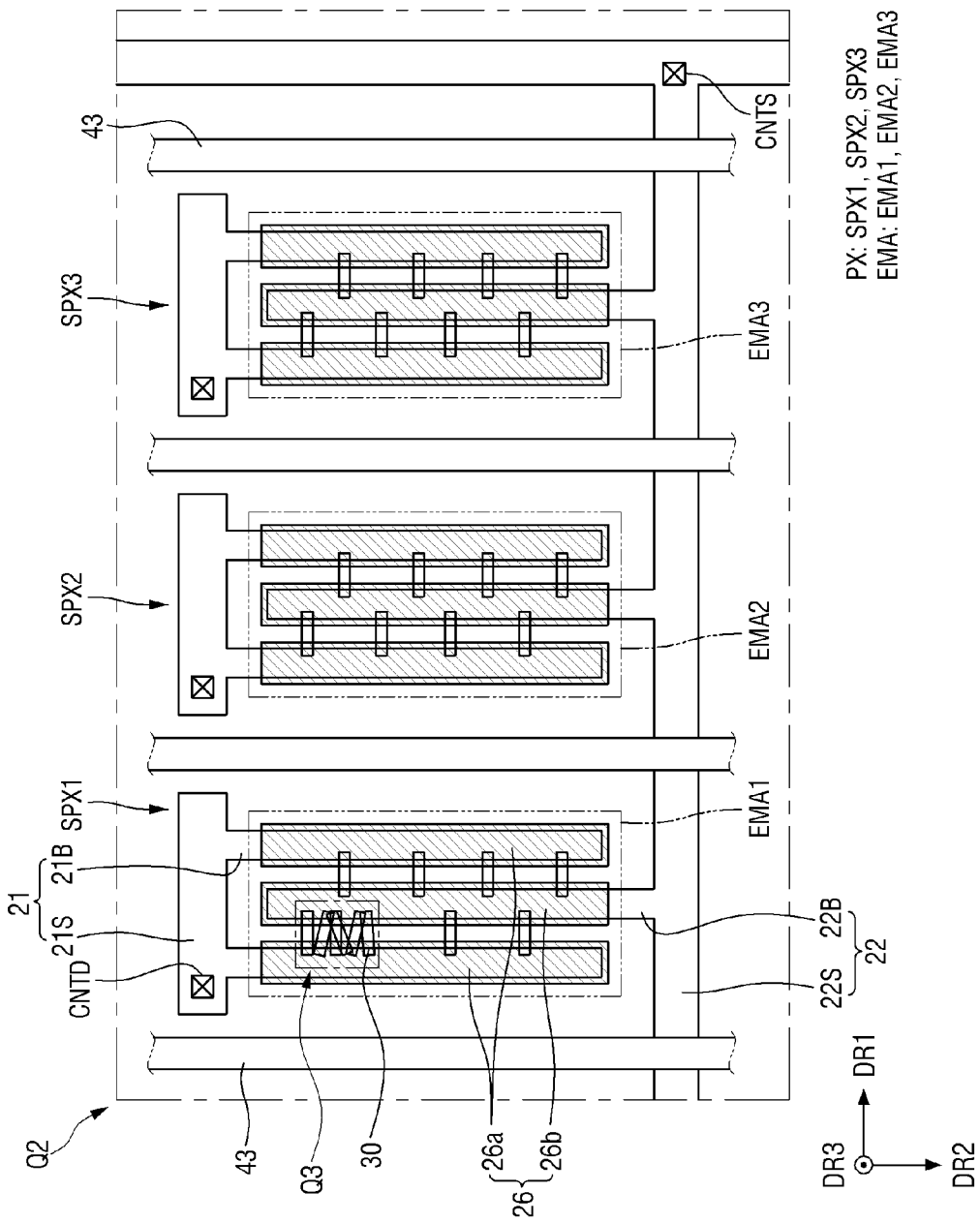
FIG. 6 is a schematic enlarged view of a Q2 area of FIG. 1.

FIG. 6 is a schematic enlarged view of the Q2 area of FIG. 1. FIG. 7 is a schematic enlarged view of a Q3 area of FIG. 6. FIG. 8 is a cross-sectional view showing a schematic cross section taken along a line X4-X4' in FIG. 7.

Figure 7:
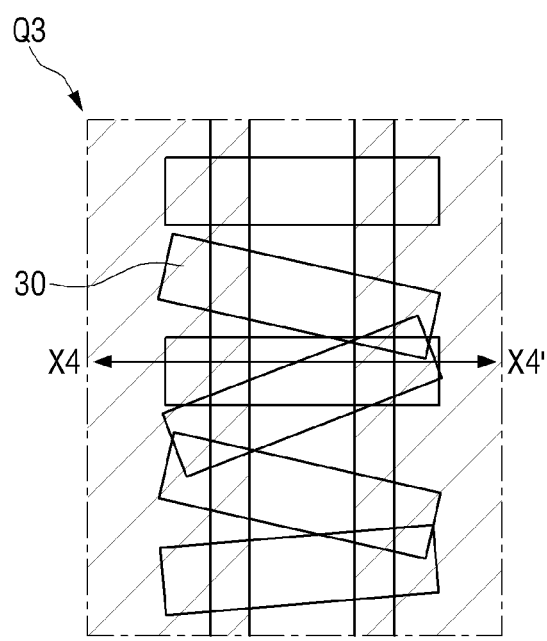
FIG. 7 is a schematic enlarged view of a Q3 area of FIG. 6.
Figure 8:
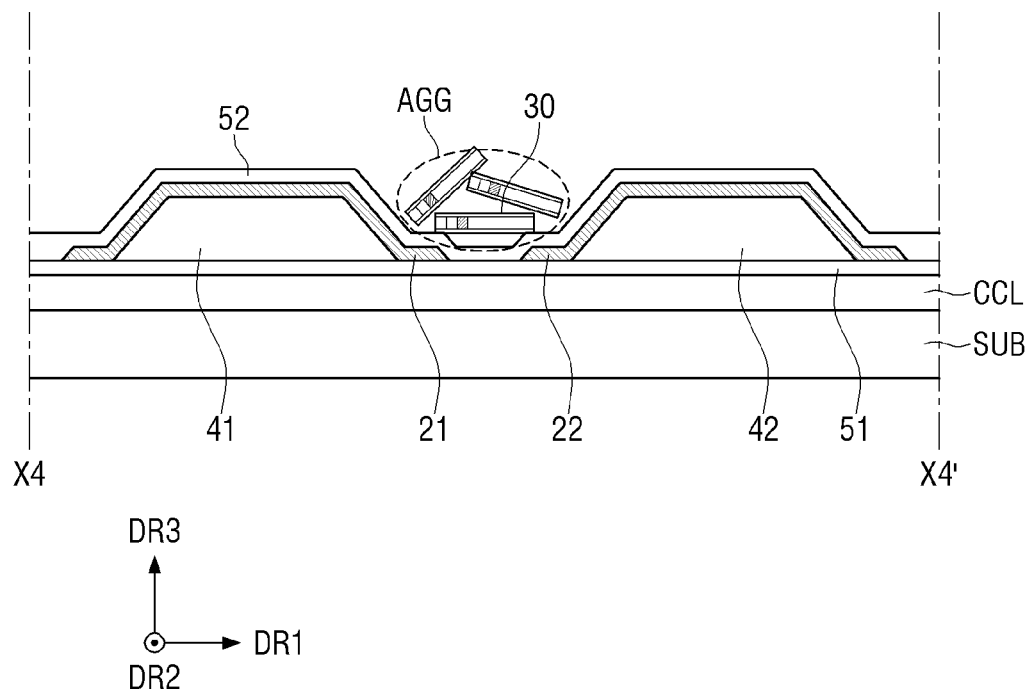
FIG. 8 is a cross-sectional view showing a schematic cross section taken along a line X4-X4' in FIG. 7.

Referring to FIGS. 6 to 8, in the defective area Q2 of the display module DM, the light-emitting elements 30 may be aggregated with each other to form a light-emitting element aggregate AGG. The light-emitting element aggregate AGG may be formed due to characteristics of an inkjet process of placing the light-emitting element 30 on the display module DM. For example, in order to increase the number of light-emitting elements 30 in the pixel PX, a concentration of the ink (90 in FIG. 19) containing the light-emitting elements 30 therein may increase. When performing the inkjet printing process multiple times, a spacing between the light-emitting elements 30 may be reduced. In case that the electric field IEL (e.g., refer to FIG. 20) for aligning the light-emitting elements 30 is applied to the light-emitting elements 30, currently sprayed light-emitting elements 30 may aggregate with the previously sprayed light-emitting elements 30. Thus, the light-emitting element aggregate AGG may be formed by the currently sprayed light-emitting elements 30 and the previously sprayed light-emitting elements 30.

In case that the light-emitting elements 30 are aggregated with each other to form the light-emitting element aggregate AGG, the light-emitting element aggregate AGG may disconnect the lines of the pixel PX or cause poor electrical contact between the lines, such that the image quality may be deteriorated. Therefore, the light-emitting element aggregate AGG may be removed in a removing process.

However, as described above, in case that the light-emitting elements is placed in the inkjet printing scheme, not only the defective area Q2 but also the normal area Q1 may be formed. According to another embodiment, all of the light-emitting elements 30 disposed on the display module DM are completely removed to remove the light-emitting element aggregate AGG formed in the defective area Q2, and the light-emitting element 30 normally disposed in the normal area Q1 may be also removed. Thus, in case that the process of placing the light-emitting element 30 is performed on an entire area of the display module DM, the process efficiency may be lowered and manufacturing time may be increased.

However, according to the embodiment, the light-emitting elements 30 of the normal area Q1 may be left (or remain) in the display module DM, and only the light-emitting element aggregate AGG of the defective area Q2 may be selectively removed from the display module DM. Thus, a second process of placing the light-emitting elements 30 into the defective area Q2 from which the light-emitting element aggregate AGG has been removed may be performed.

Hereinafter, an apparatus 1 for removing the bipolar element which may selectively remove only the light-emitting element aggregate AGG of the defective area Q2 is described below.

Figure 9:
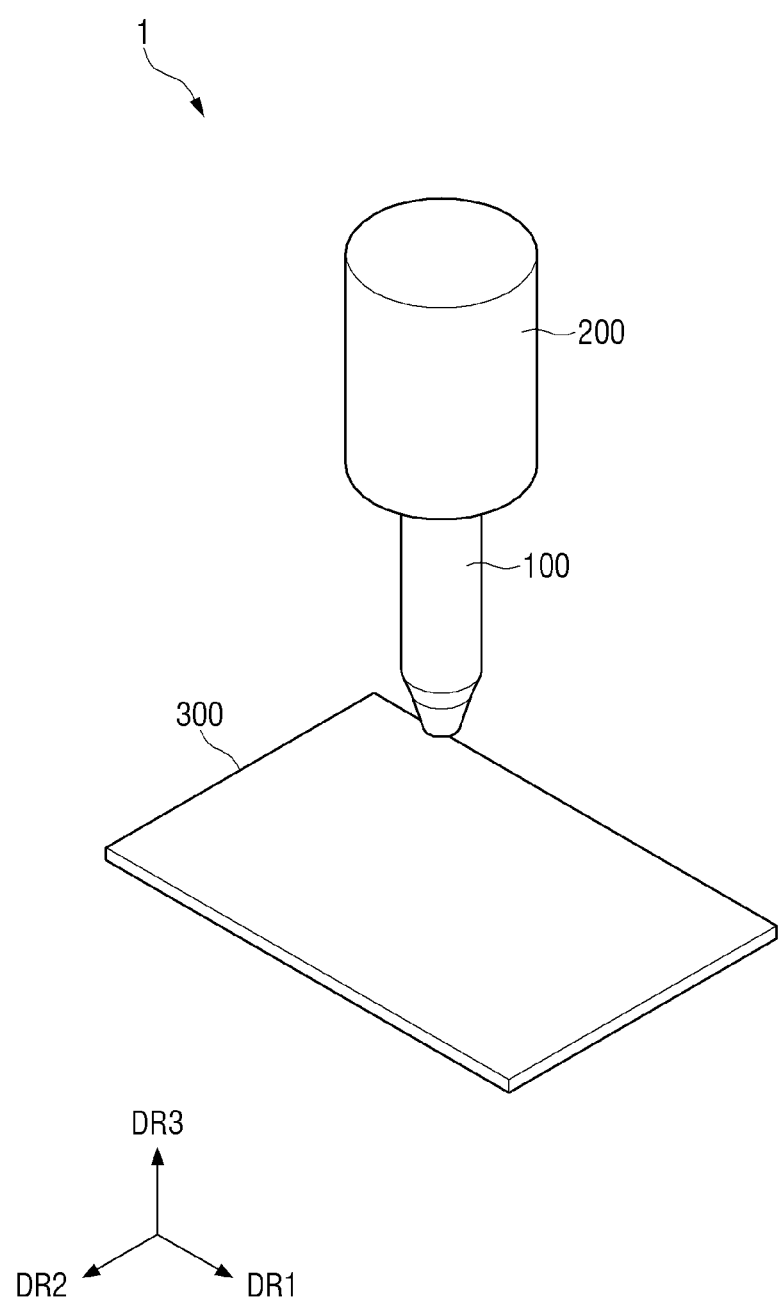
FIG. 9 is a perspective view schematically showing an apparatus for removing a bipolar element according to an embodiment.
Figure 10:
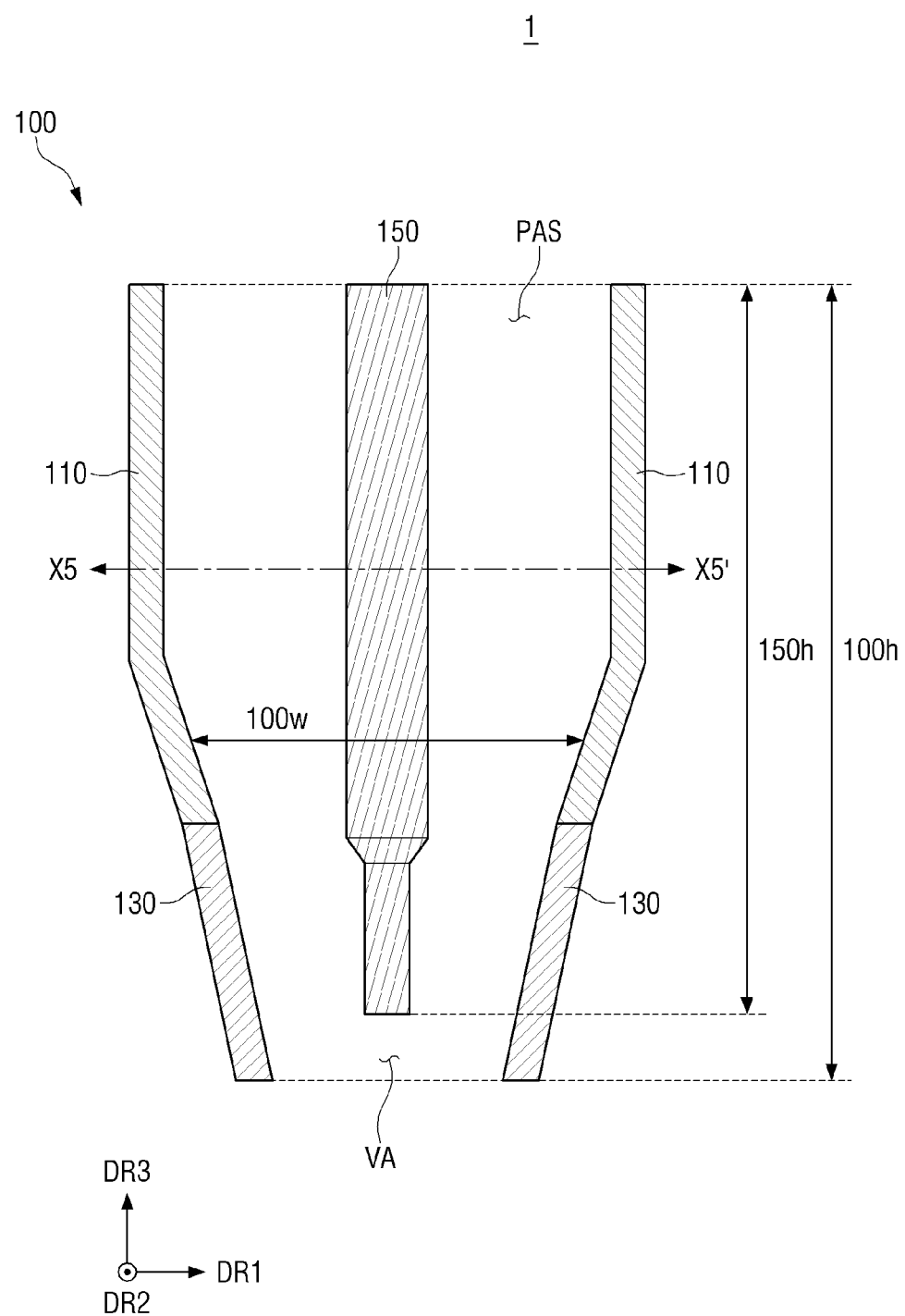
FIG. 10 is a structure diagram schematically showing an inside of a remover of the apparatus for removing the bipolar element according to an embodiment of FIG. 9.
Figure 11:
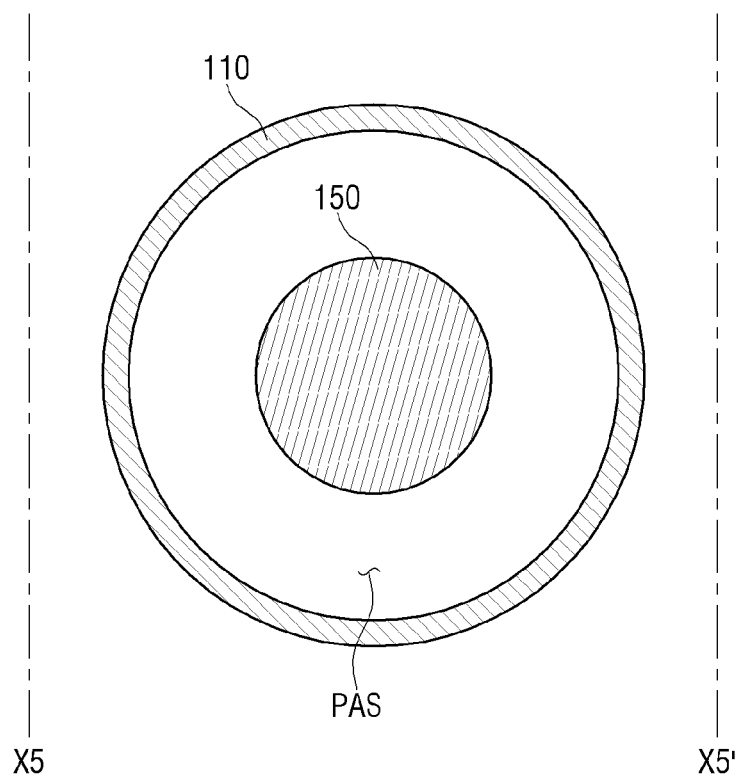
FIG. 11 is a cross-sectional view showing a schematic cross-section taken along a line X5-X5' in FIG. 10.

FIG. 9 is a perspective view schematically showing an apparatus for removing a bipolar element according to an embodiment. FIG. 10 is a structure diagram schematically showing an inside of a remover of the apparatus for removing the bipolar element according to the embodiment of FIG. 9. FIG. 11 is a cross-sectional view showing a schematic cross-section taken along a line X5-X5' in FIG. 10.

Referring to FIGS. 9 to 11, the apparatus 1 for removing the bipolar element according to an embodiment may include a remover 100, a solvent storage 200, and a stage 300.

The stage 300 may serve to seat the above-described display module DM thereon. The display module DM may be seated on the stage 300, and a process of removing the light-emitting element aggregate AGG may be performed thereon.

The solvent storage 200 may supply solvent SV (e.g., refer to FIGS. 12 to 17) needed for the bipolar element removal process to the remover 100, and may serve to collect the solvent SV from the remover 100 again after the bipolar element removal process has been finished. In some embodiments, the solvent storage 200 may be disposed directly above the remover 100. However, the disclosure is not limited thereto. For example, the solvent storage 200 may be spaced apart from the remover 100, and the solvent SV may be supplied to or collected from the remover 100 via a separate connection pipe (not shown). Hereinafter, for convenience of description, following description will be made based on a case in which the solvent storage 200 is disposed on the remover 100.

The remover 100 may serve to remove the light-emitting element aggregate AGG on the display module DM. The remover 100 may include a partition wall defining a solvent channel PAS, and a vibrator 150. The remover 100 may be disposed on the stage 300 and may move on and along the stage 300 in a first direction DR1 or a second direction DR2 under an operation of a separate moving part (not shown). For example, the separate moving part (not shown) may transport the remover 100 on the stage 300 in the first direction DR1 and the second direction DR2. This movement of the remover 100 may be done for selectively performing the removal process on the defective area Q2 of the display module DM.

The partition wall of the remover 100 may define an exterior appearance of the remover 100, and define the solvent channel PAS, through which inputting (or injecting) and discharging of the solvent SV are performed. The partition wall of the remover 100 may serve to prevent the solvent SV from spreading to an outside for the bipolar element removal process. Detailed description of the bipolar element removal process is provided below.

The solvent channel PAS may serve as a channel for injecting or discharging the solvent SV required in the bipolar element removal process to be described below. For example, an inner space defined by the partition wall of the remover 100 may be an empty space, and the remover 100 may have a tube shape with the inner empty space. In some embodiments, the partition wall of the remover 100 may have a circular shape in a cross-section as shown in FIG. 11. However, the disclosure is not limited thereto. Hereinafter, for convenience of description, the cross section of the partition wall may have the circular shape.

A dimension (or width) 100w of the solvent channel PAS in the first direction DR1 may be decreased as the channel extends toward another side of the remover 100 in the third direction DR3 (e.g., in a direction toward the stage 300). This may be intended not to enlarge an area in which a process as described below to selectively remove the light emitting device aggregate AGG in the defective area Q2 is performed into an area greater than necessary.

The partition wall of the remover 100 may include a first partition wall 110 and a second partition wall 130 disposed at the another side in the third direction DR3 of the first partition wall 110. The first partition wall 110 may be disposed adjacent to the solvent storage 200, and the second partition wall 130 may be disposed adjacent to the stage 300 or the display module DM.

The first partition wall 110 may be made of a material with rigidity. Since the first partition wall 110 is made of a rigid material, the solvent SV may move stably between the solvent storage 200 and the remover 100. In some embodiments, the first partition wall 110 may include a metal having rigidity. For example, the first partition wall 110 may include a metal such as SUS304. However, the disclosure is not limited thereto.

The second partition wall 130 may include a material having a lower rigidity than that of the first partition wall 110. For example, the second partition wall 130 may be softer than the first partition wall 110. The second partition wall 130 may be a portion in direct contact with the second insulating layer 53 (e.g., refer to FIG. 13) as the topmost portion of the display module DM for the bipolar element removal process to be described below. In case that the second partition wall 130 includes a material having a rigidity similar to that of the first partition wall 110, there is a risk that the wall 130 may damage the second insulating layer 53. However, in the embodiment, the second partition wall 130 may include the material having a lower rigidity than that of the first partition wall 110 and thus may not damage the second insulating layer 53 even in case that the wall 130 directly contacts the second insulating layer 53 in the bipolar element removal process. In some embodiments, the second partition wall 130 may include a material having softness. For example, the second partition wall 130 may include, but is not limited to, a material such as polyimide (PI), polyethylene terephthalate (PET), or rubber.

Since the second partition wall 130 is in direct contact with the second insulating layer 53, the second partition wall 130 may effectively prevent the solvent SV injected for the bipolar element removal process from spreading out of the remover 100. Detailed description thereof is provided below.

The vibrator 150 of the remover 100 may serve to vibrate the solvent SV input (or injected) in the bipolar element removal process to be described below to remove the light-emitting element aggregate AGG from the display module DM. In some embodiments, the vibrator 150 may be embodied as an ultrasonic vibrator 150 that applies ultrasonic waves. However, the disclosure is not limited thereto. Hereinafter, for the convenience of description, an example in which the vibrator 150 is embodied as the ultrasonic vibrator 150 is mainly described.

The vibrator 150 may be disposed in (or extend through) the interior of the remover 100. For example, the vibrator 150 may be disposed in the inner space defined by the partition wall and may extend through (or pass through) the solvent channel PAS as shown in FIGS. 10 and 11. In some embodiments, the vibrator 150 may be spaced apart from the partition wall in the first direction DR1.

The vibrator 150 may have a rod shape extending in the third direction DR3. As shown in FIG. 10, a third direction DR3 dimension (e.g., height) 150h of the vibrator 150 may be smaller than a third direction DR3 dimension (e.g., height) 100h of the partition wall. For example, another end (e.g., another side distal end) in the third direction DR3 of the vibrator 150 may be in the third direction DR3 spaced apart from another end (e.g., another side distal end) in the third direction DR3 of the second partition wall 130, and the another side distal end in the third direction DR3 of the vibrator 150 may not overlap in the first direction DR1 the another side distal end in the third direction DR3 of the second partition wall 130. Accordingly, in the inner space of the remover 100, a vibration space VA, which is a space between the another side distal end in the third direction DR3 of the vibrator 150 and the another side distal end in the third direction DR3 of the second partition wall 130, may be defined.

The solvent SV input (or injected) from the solvent storage 200 to the remover 100 may be received in the vibration space VA and may be vibrated by the vibrator 150. A detailed description thereof is provided below.

Hereinafter, the bipolar element removal process using the apparatus 1 for removing the bipolar element according to an embodiment and a subsequent further application process are described below in conjunction with FIGS. 12 to 20.

Figure 12:
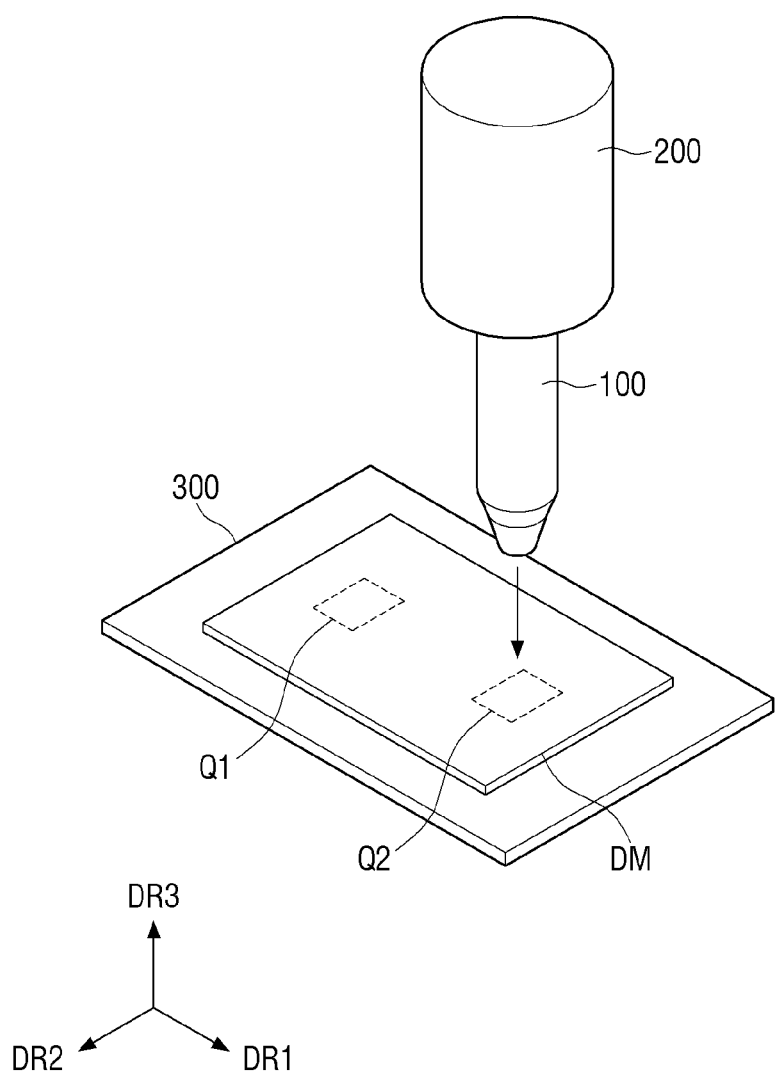
FIG. 12 is a perspective view schematically showing an apparatus for removing a bipolar element according to an embodiment.
Figure 18:
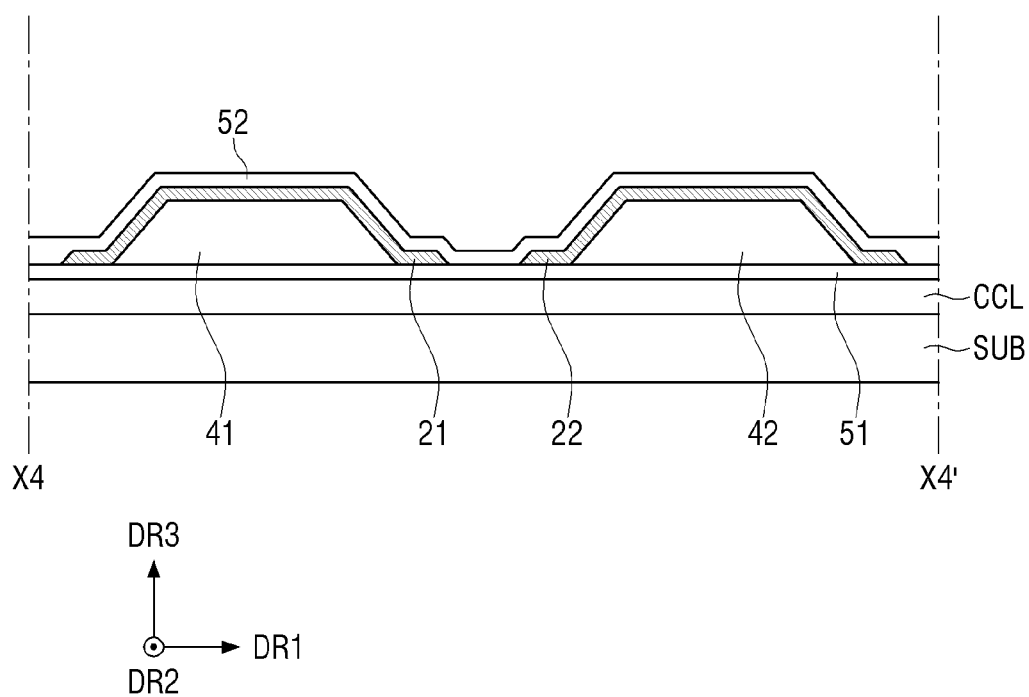
FIGS. 18 to 20 are schematic cross-sectional views of steps to illustrate a further application process performed after the bipolar element removal process.
Figure 19:
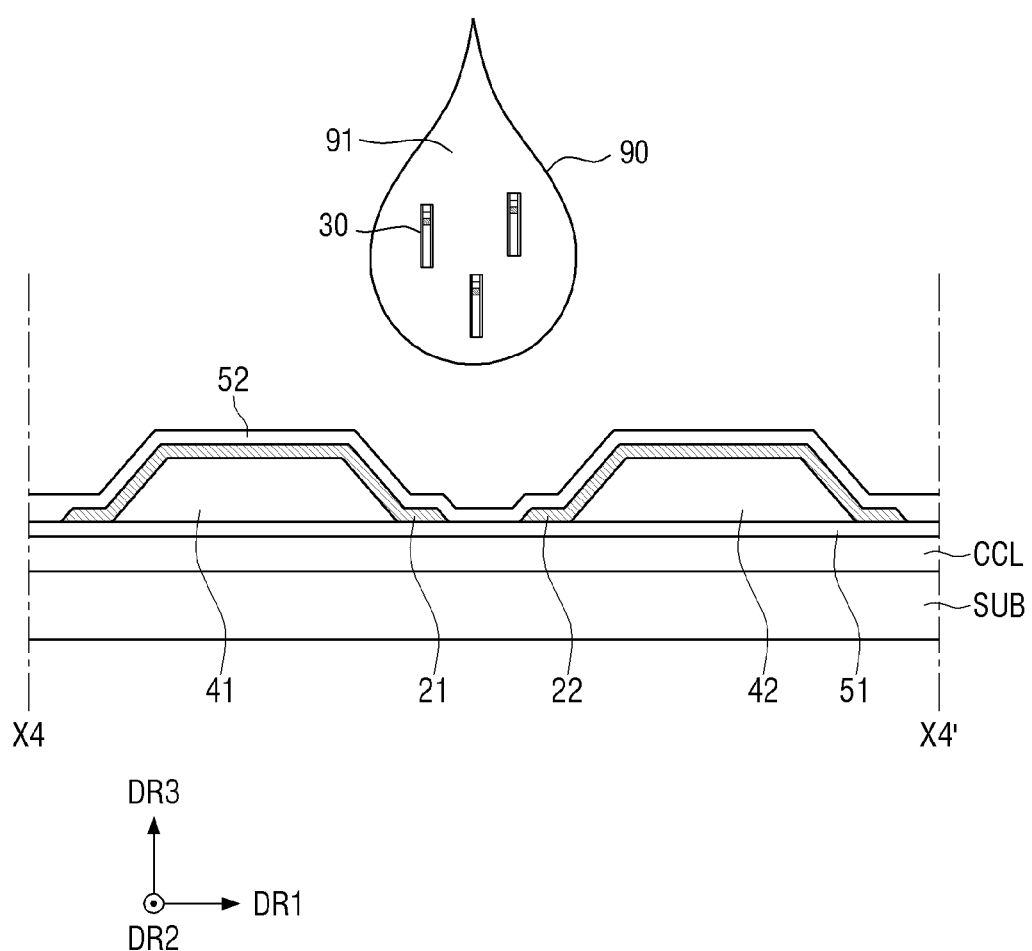
Figure 20:
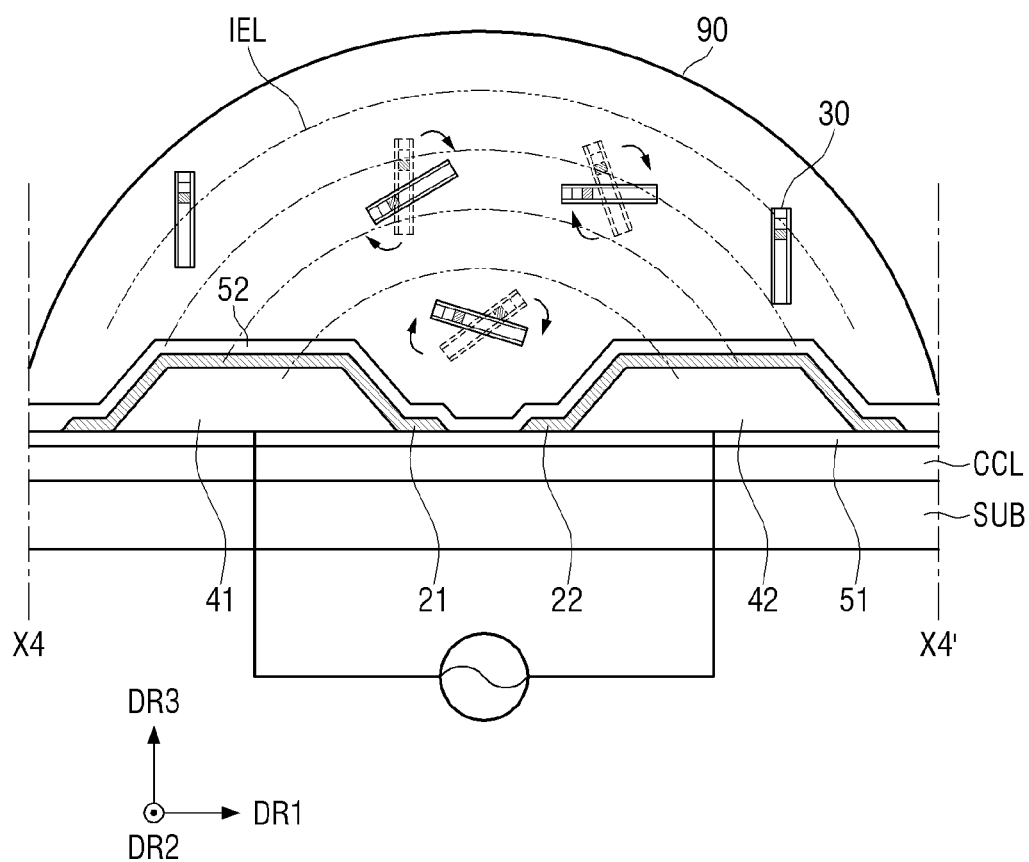

FIG. 12 is a perspective view schematically showing an apparatus for removing a bipolar element according to an embodiment. FIGS. 13 to 17 are schematic cross-sectional views of steps to illustrate the bipolar element removal process using the apparatus for removing the bipolar element of FIG. 12. FIGS. 18 to 20 are schematic cross-sectional views of steps to illustrate the further application process performed after the bipolar element removal process.

Referring to FIGS. 12 to 17, the bipolar element removal process using the apparatus 1 for removing the bipolar element according to an embodiment may include moving the remover 100 to the defective area Q2, a step of bringing the remover 100 into close contact with the display module DM, a step of injecting the solvent SV so as to cover the light-emitting element aggregate AGG with the solvent SV, a step of vibrating the solvent SV to remove the light-emitting element aggregate AGG from the display module DM, discharging the removed light-emitting element aggregate AGG and solvent SV.

Referring to FIG. 12, the process (e.g., the bipolar element removal process) may include placing the display module DM on the stage 300 and the moving of the remover 100 to the defective area Q2 of the display module DM. As described above, the light-emitting element 30 may be placed on the display module DM using the inkjet printing process. Thus, the defective area Q2, in which the light-emitting elements 30 are aggregated with each other, may be formed. The remover 100 may move in the first direction DR1 or in the second direction DR2 on and along the stage 300. Thus, the remover 100 may be located selectively in the defective area Q2.

Figure 14:
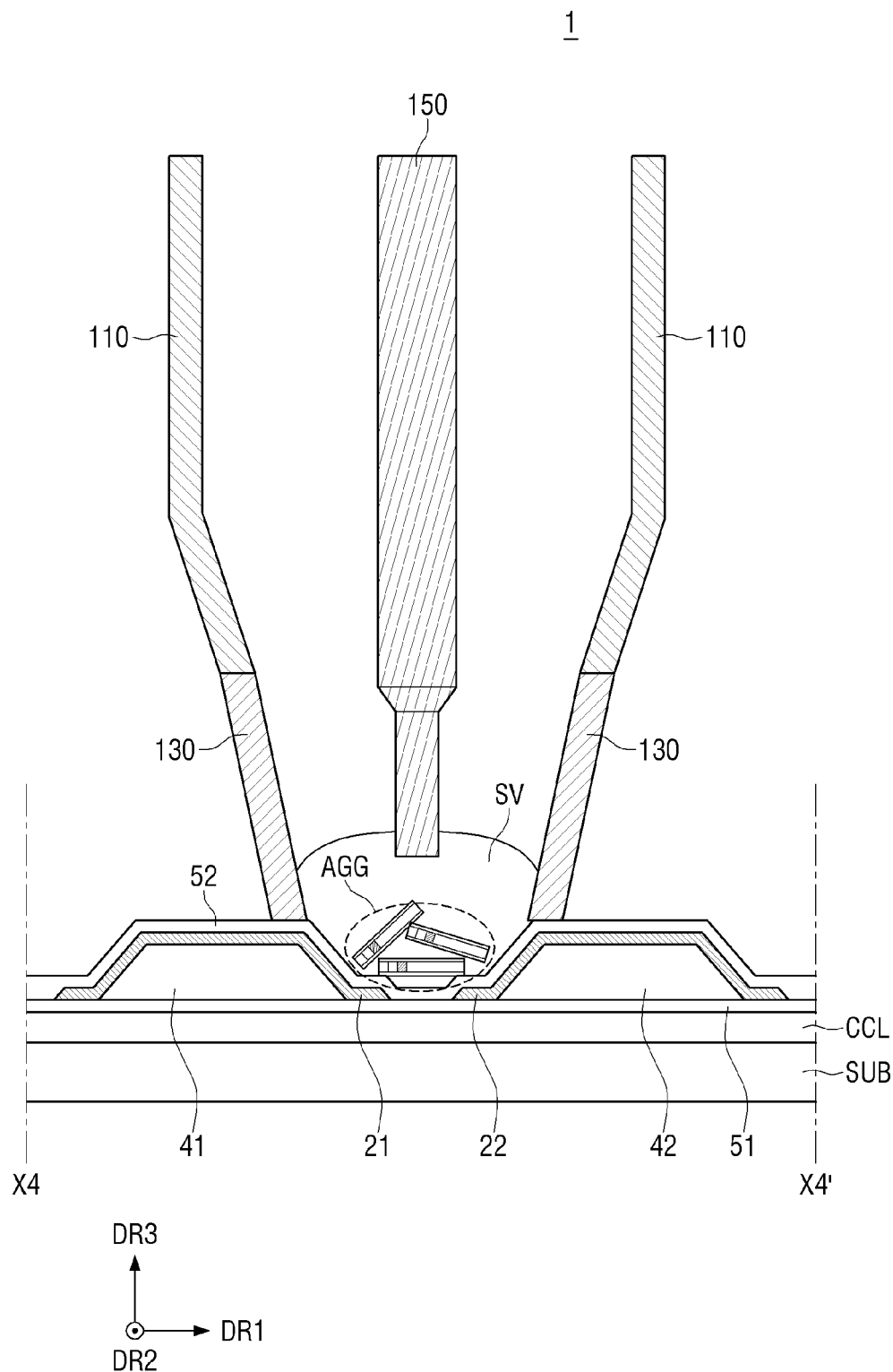

Referring to FIGS. 13 and 14, the process (e.g., the bipolar element removal process) may include bringing the remover 100 into close contact with the defective area Q2 of the display module DM, injecting the solvent SV thereto through the solvent channel PAS, and placing the solvent SV in a vibration area. For example, the second partition wall 130 of the remover 100 may directly contact the second insulating layer 52 of the display module DM.

As described above, the second partition wall 130 may include a material having a relatively low rigidity. Thus, the second partition wall 130 may not apply the damage to the second insulating layer 52 even in case that the wall 130 directly contacts the second insulating layer 52. The vibrator 150 may overlap the light-emitting element aggregate AGG in the third direction DR3. In some embodiments, the second partition wall 130 may overlap the inner banks 41 and 42 in a plan view and may be in close contact with the defective area Q2 of the display module DM. However, the disclosure is not limited thereto.

The solvent SV may be introduced into the remover 100 via the solvent channel PAS and may be placed in the above-mentioned vibration area. For example, the solvent SV may cover the light-emitting element aggregate AGG disposed between the inner banks 41 and 42, and may be in direct contact with the vibrator 150.

The solvent SV may serve to transmit the vibration of the vibrator 150 to the light-emitting element aggregate AGG so as to remove the light-emitting element aggregate AGG from the display module DM. The solvent SV may be a liquid substance. In case that the vibrator 150 transmits the vibration to the light-emitting element aggregate AGG via a gas medium, the adhesion of the light-emitting element aggregate AGG may be large. Thus, the light-emitting element aggregate AGG may not be removed from the display module DM, and the removal may not be performed reliably. In the embodiment, the solvent SV may be made of a liquid substance and may reliably transmit the vibration of the vibrator 150 to the light-emitting element aggregate AGG. In some embodiments, the solvent SV may include at least one of acetone, water, alcohol, toluene, propylene glycol (PG), and propylene glycol methyl acetate (PGMA). However, the disclosure is not limited thereto.

Figure 16:
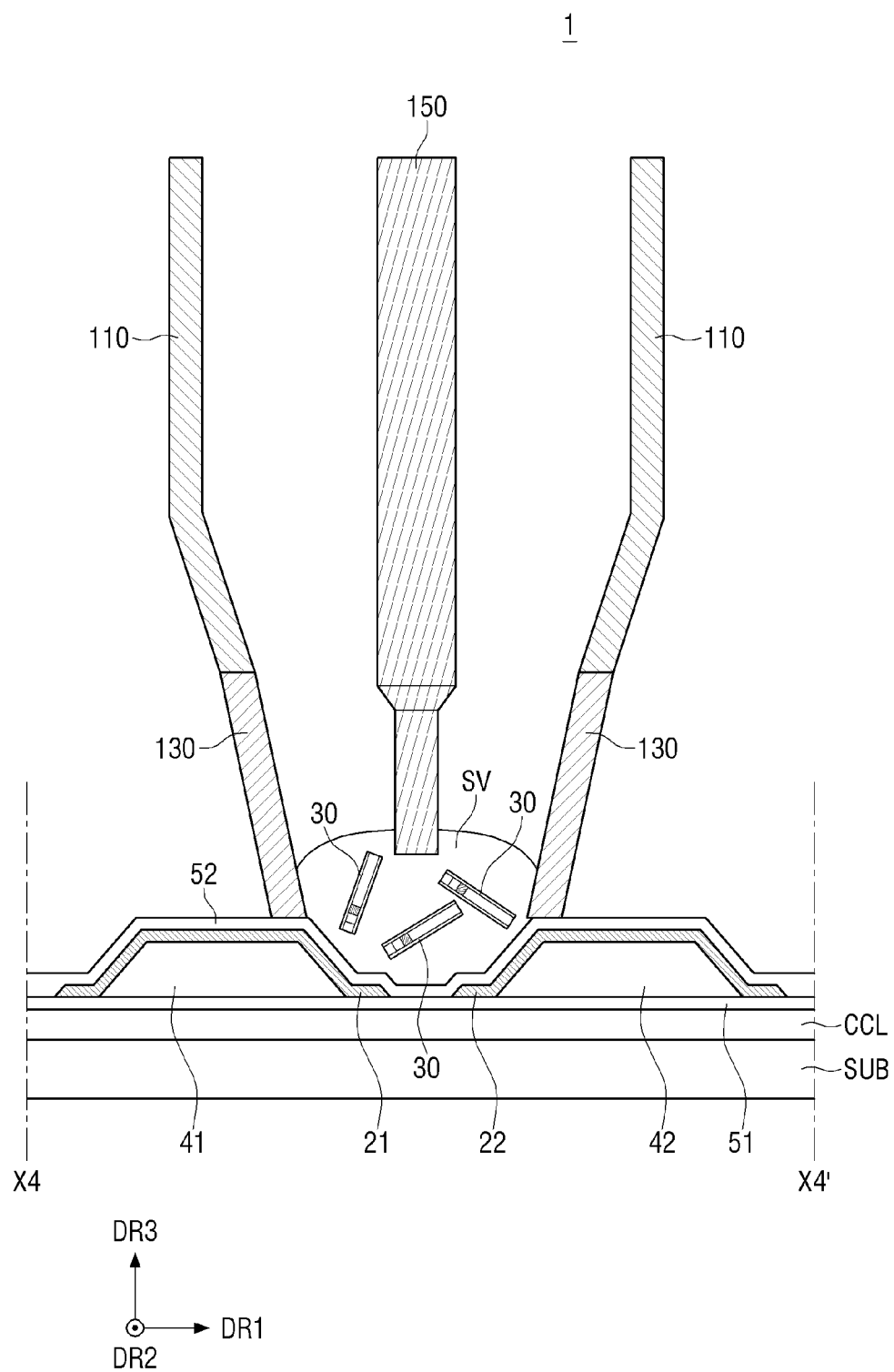

Referring to FIGS. 15 and 16, the vibrator 150 may vibrate the solvent SV to remove the light-emitting element aggregate AGG from the display module DM. The vibration of the vibrator 150 may be performed, for example, in an ultrasonic vibration manner.

As described above, when the solvent SV is made of a liquid substance, the vibration of the vibrator 150 may be reliably transmitted to the light-emitting element aggregate AGG via the solvent SV. Thus, the light-emitting element aggregate AGG may be removed from the display module DM under vibration of the vibrator 150. Therefore, the light-emitting element aggregate AGG may be converted to separate and free light-emitting elements 30 which may be suspended in the solvent SV.

Figure 17:
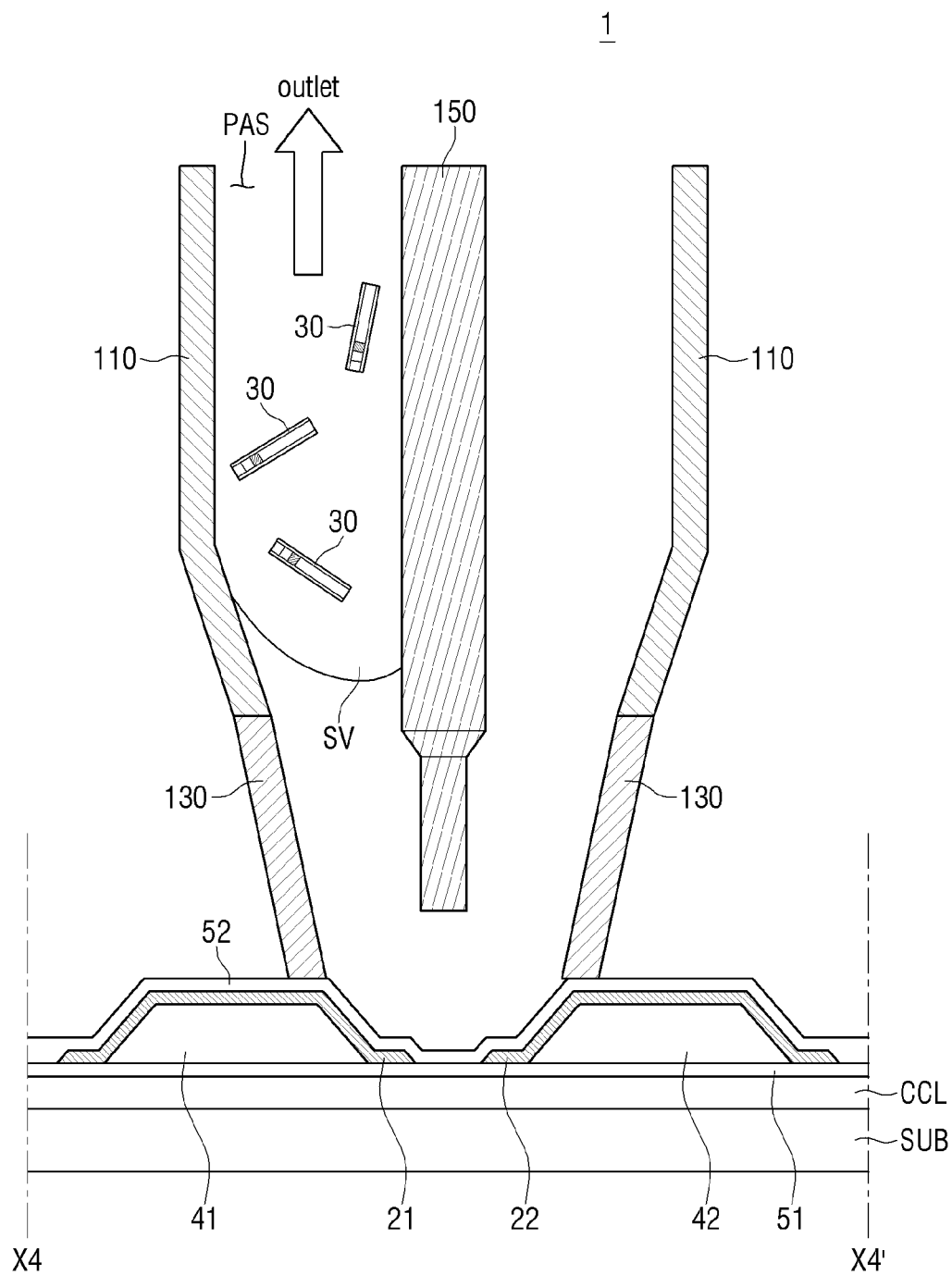

Referring to FIG. 17, the process (e.g., the bipolar element removal process) may include discharging the solvent SV in which the removed light-emitting elements 30 are suspended through the solvent channel PAS. The discharging of the solvent SV may be performed, for example, using a vacuum (e.g., a vacuum device).

The process as described above may allow the light-emitting element aggregate AGG formed in the defective area of the display module DM to be removed therefrom. Hereinafter, the further application process performed after the bipolar element removal process is described below.

Referring to FIGS. 18 to 20, the further application process, which is performed after the bipolar element removal process, may be selectively performed on the defective area Q2 from which the light-emitting element aggregate AGG has been removed. The further application process may be, for example, an inkjet printing process.

Referring to FIG. 18, the further application process may include preparing the display module DM from which the light-emitting element aggregate AGG has been removed.

Referring to FIG. 19, the process (e.g., the bipolar element removal process) may include spraying the ink 90, in which the light-emitting elements 30 are dispersed, in a liquid 91 on the first electrode 21 and the second electrode 22. The liquid 91 may include substantially the same material as that of the aforementioned solvent SV. The light-emitting element 30 may refer to a bipolar element. The spraying of the ink 90, in which the light-emitting elements 30 are dispersed in the liquid 91, may be performed using an inkjet printing method. As shown in the drawing, the inkjet printing device according to an embodiment may uniformly maintain the number of light-emitting elements 30 in the ink 90 and eject the ink 90.

Referring to FIG. 20, an electric signal may be applied across the first electrode 21 and the second electrode 22, and the electric field IEL may be generated in the ink 90 in which the light-emitting elements 30 are dispersed in the liquid 91. A dielectrophoretic force may be transmitted to the light-emitting elements 30 under the electric field IEL such that the orientation direction and position thereof are changed. Thus, the light-emitting elements 30 may be seated between the first electrode 21 and the second electrode 22.

The liquid 91 of the ink 90 may be removed. Under the above process, the light-emitting elements 30 disposed in the defective area Q2 of the display module DM may be aligned with each other in the same manner in which the light-emitting elements 30 disposed in the normal area Q1 as shown in FIG. 4 are aligned with each other.

Hereinafter, another embodiment of an apparatus 1 for removing the bipolar element according to an embodiment is described. In a following embodiment, the same components as those of the previously described embodiments have the same reference numerals, and repetitive descriptions thereof are omitted or simplified, and following descriptions are focused on differences therebetween.

Figure 21:
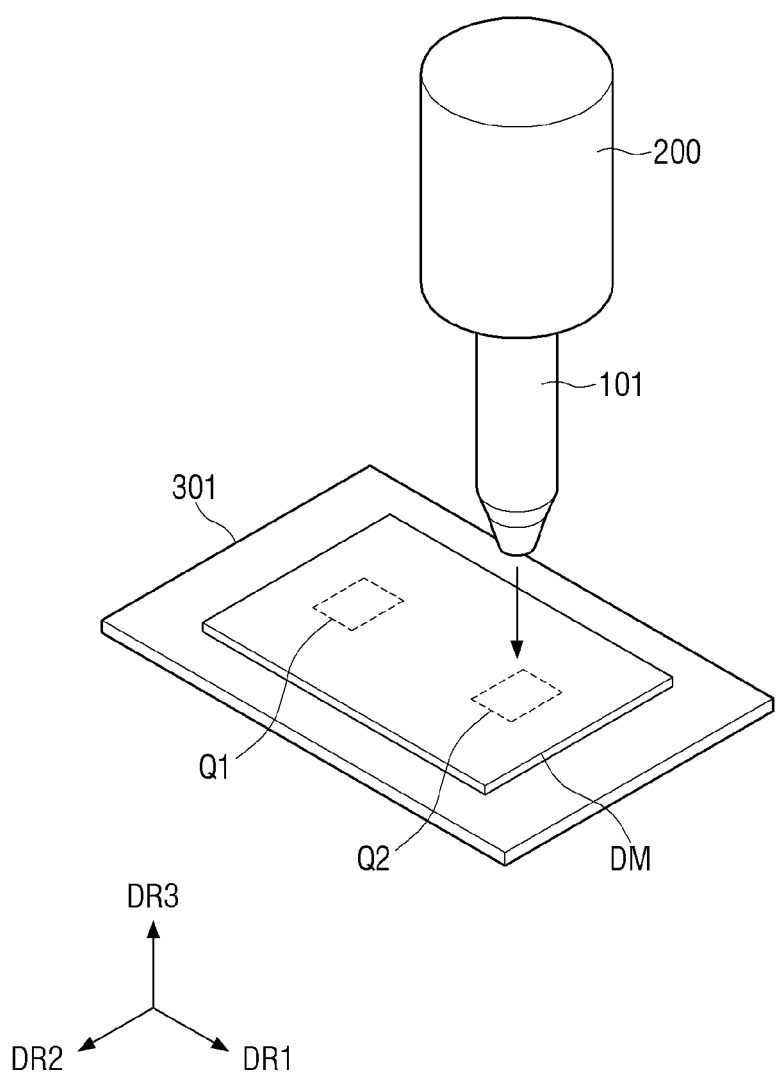
FIG. 21 is a perspective view schematically showing an apparatus for removing a bipolar element according to another embodiment.
Figure 22:
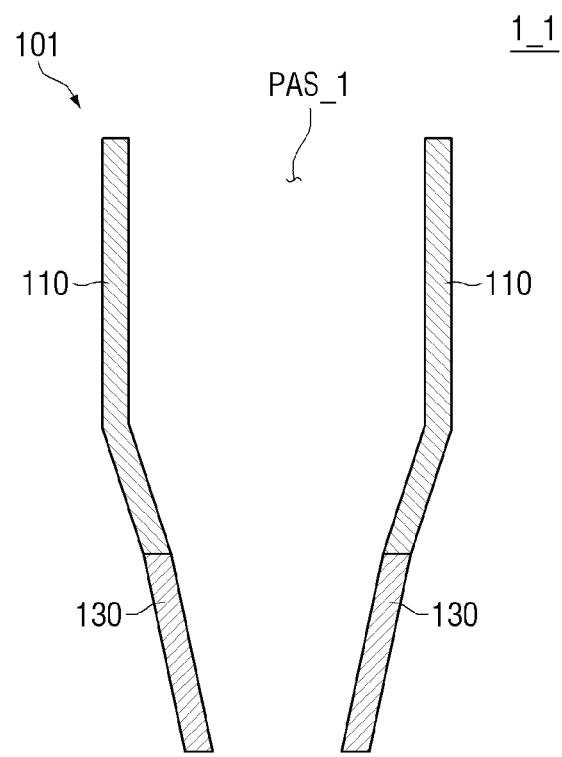
FIG. 22 is a structure diagram schematically showing an inside of a remover of the apparatus for removing the bipolar element according to an embodiment of FIG. 21.

FIG. 21 is a perspective view schematically showing an apparatus for removing a bipolar element according to another embodiment. FIG. 22 is a structure diagram schematically showing an inside of a remover of the apparatus for removing the bipolar element according to the embodiment of FIG. 21. FIGS. 23 to 27 are schematic cross-sectional views of steps to illustrate the bipolar element removal process using the apparatus for removing the bipolar element according to the embodiment of FIG. 21.

Referring to FIGS. 21 and 22, in an apparatus 1_1 for removing the bipolar element according to this embodiment, the stage 301 may serve as a vibrator, and a separate vibrator 150 (e.g., refer to FIG. 10) of the remover 101 may be omitted. For example, the stage 301 may vibrate the display module DM seated on the stage 301 to vibrate the solvent SV received in the remover 101 in close contact with the display module DM, and remove the light-emitting element 30 of the display module DM therefrom.

The stage 301 may cover an entire area of the display module DM. In case that the bipolar element removal process is performed, the stage 301 may apply the vibration to the entire area of the display module DM. Detailed description of the bipolar element removal process is provided below. In some embodiments, the stage 301 may be embodied as a vibrator using ultrasound. However, the disclosure is not limited thereto.

The separate vibrator (not illustrated) inside the remover 101 may be omitted due to the structure as described above. Thus, a structure of the remover 101 may further be simplified. Thus, a wider solvent channel PAS_1 may be secured, and movement of the remover 101 may be improved.

Hereinafter, the bipolar element removal process using the apparatus 1_1 for removing the bipolar element according to this embodiment is described below.

Referring to FIGS. 23 to 27 in conjunction with FIG. 21, the bipolar element removal process using the apparatus 1_1 for removing the bipolar element according to this embodiment may include moving the remover 101 to the defective area Q2, bring the remover 101 into a close contact with the display module DM, injecting the solvent SV to cover the light-emitting element aggregate AGG with the solvent SV, vibrating the solvent SV to remove the light-emitting element aggregate AGG from the display module DM, discharging the removed light-emitting element aggregate AGG and solvent SV. In FIGS. 23 to 27, both a portion in which the light-emitting element aggregate AGG is formed and a portion in which the light-emitting elements 30 are normally aligned with each other are illustrated for comparison between the normal area Q1 and the defective area Q2.

The bipolar element removal process using the apparatus 1_1 for removing the bipolar element according to this embodiment and the bipolar element removal process using the apparatus 1 for removing the bipolar element according to an embodiment may be different from each other at least in that vibrating the solvent SV to remove the light-emitting element aggregate AGG is performed. Remaining steps thereof may be substantially the same as or similar to each other. Thus, a following description is focus on the removing of the light-emitting element aggregate AGG by the vibrating of the solvent SV. Detailed description of the same constituent steps is briefly mentioned or omitted.

Referring to FIG. 21, the process (e.g., the bipolar element removal process) may include placing the display module DM on the stage 301 and moving the remover 101 to the defective area Q2 of the display module DM.

Figure 23:
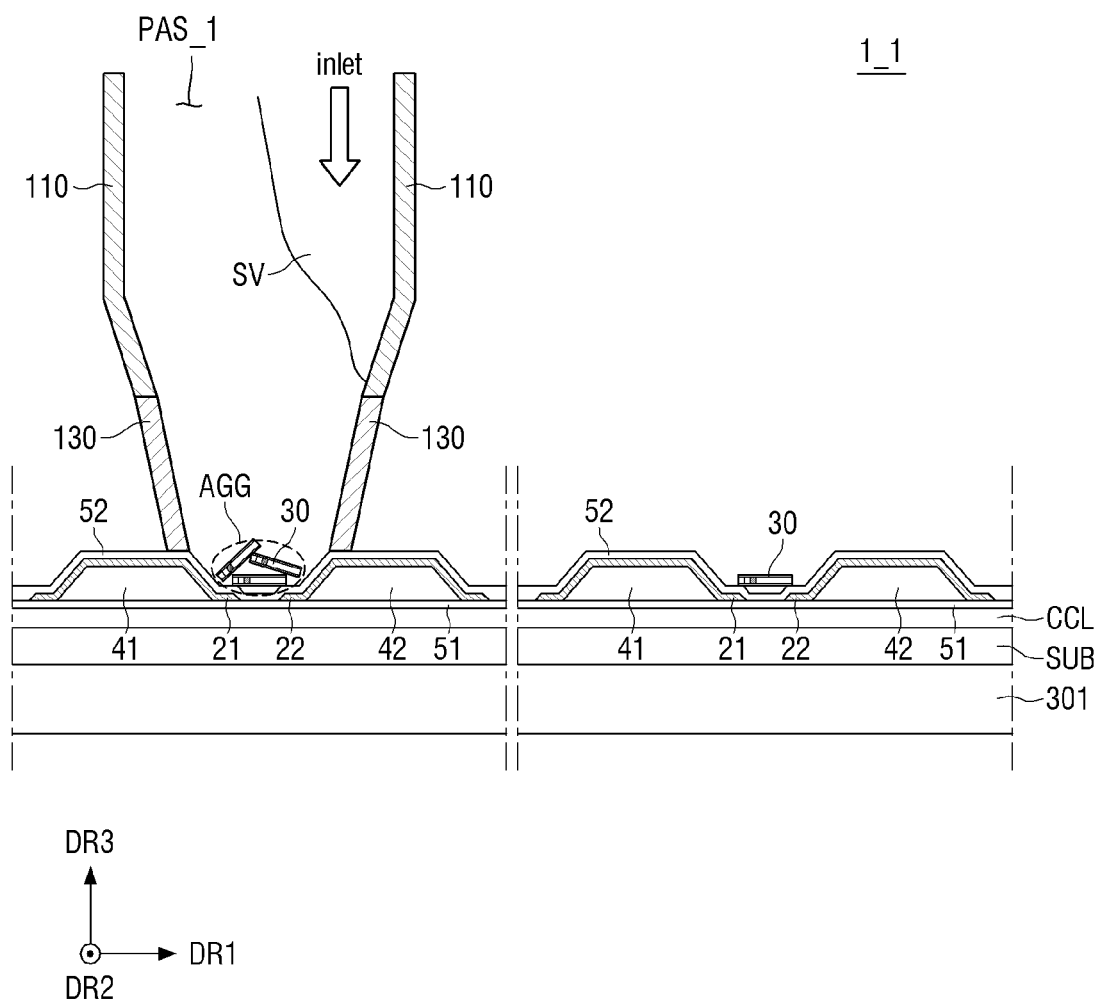
FIGS. 23 to 27 are schematic cross-sectional views of steps to illustrate a bipolar element removal process using the apparatus for removing the bipolar element according to an embodiment of FIG. 21.
Figure 24:
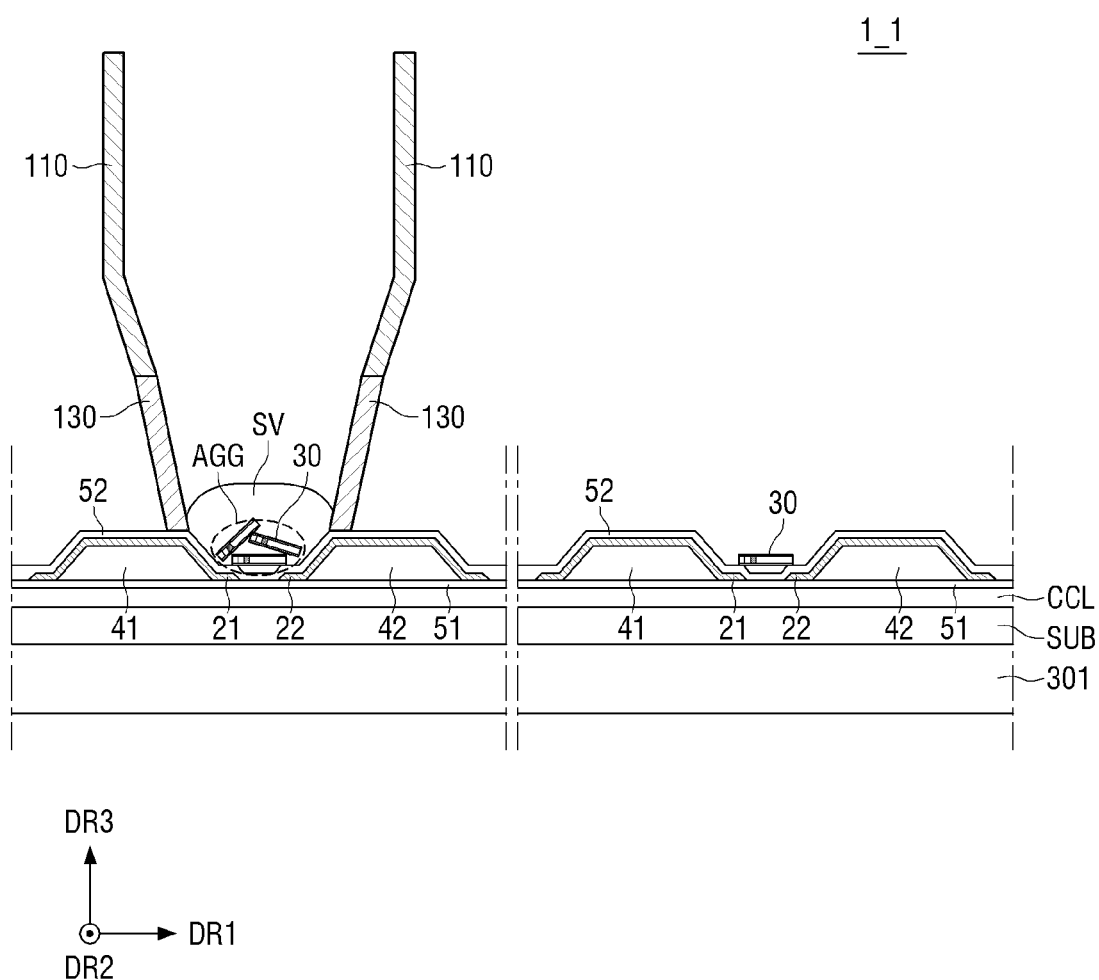

Referring to FIGS. 23 and 24, the process (e.g., the bipolar element removal process) may include bring the remover 101 into a close contact with the defective area Q2 of the display module DM, injecting the solvent SV through the solvent channel PAS_1, and placing the solvent SV in the vibration area.

Figure 25:
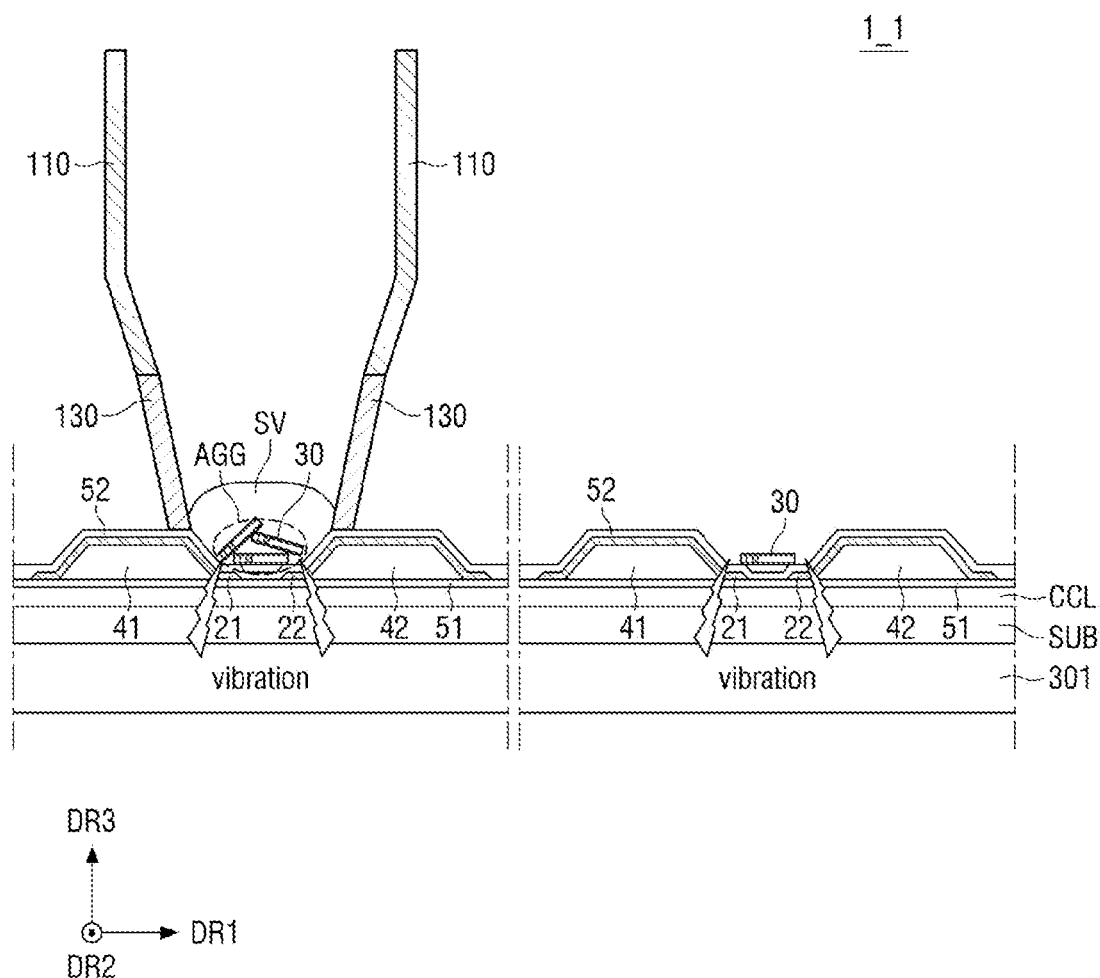
Figure 26:
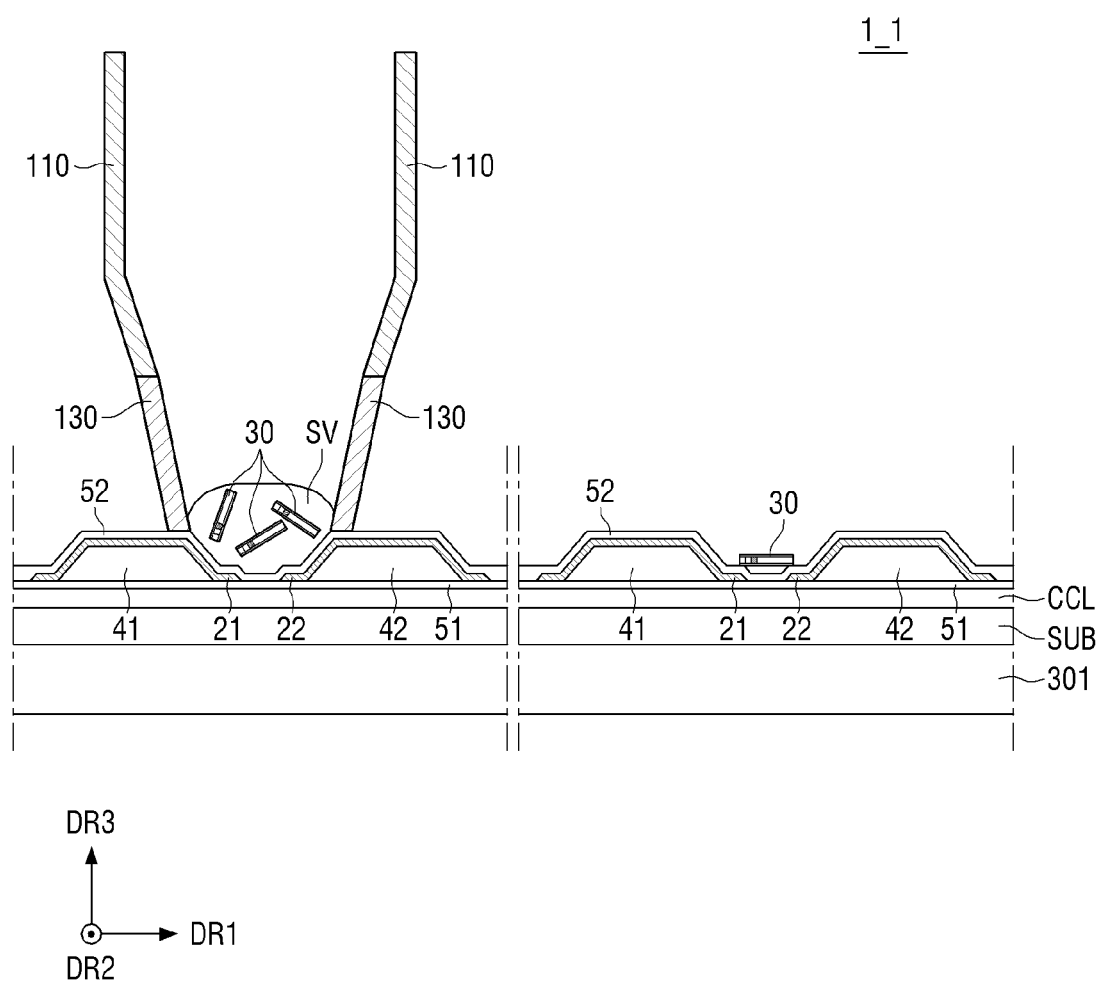

Referring to FIGS. 25 and 26, the stage 301 may vibrate the display module DM to vibrate the solvent SV in the remover 101. Thus, the light-emitting element aggregate AGG may be removed from the display module DM. The vibration of the stage 301 may be performed, for example, in an ultrasonic vibration manner.

As described above, in the presence of the solvent SV in the liquid state, the vibration of the stage 301 may be reliably transmitted to the light-emitting element aggregate AGG, and the light-emitting element aggregate AGG may be removed from the display module DM. However, according to another embodiment, in case that there is no solvent SV, the vibration may not be transmitted reliably to the light-emitting element aggregate AGG.

In the embodiment, the vibration of the stage 301 may lead to vibration of the entire area of the display module DM and may vibrate the solvent SV received in the remover 101 closely contacting the display module DM. The vibration of the stage 301 may be reliably transmitted to the light-emitting element aggregate AGG in the defective area Q2 via the solvent SV received in the remover 101, and the light-emitting element aggregate AGG may be removed from the display module and converted into free and separate light-emitting elements 30. In the normal area Q1, the remover 101 may not be disposed and the solvent SV may not be disposed. Thus, the vibration of the stage 301 may not be reliably transmitted to the light-emitting elements 30 in the normal area, and the light-emitting elements 30 therein may not deviate from the aligned state with each other.

Accordingly, the apparatus 1_1 for removing the bipolar element according to the embodiment may selectively remove the light-emitting element aggregate AGG of the defective area Q2.

Figure 27:
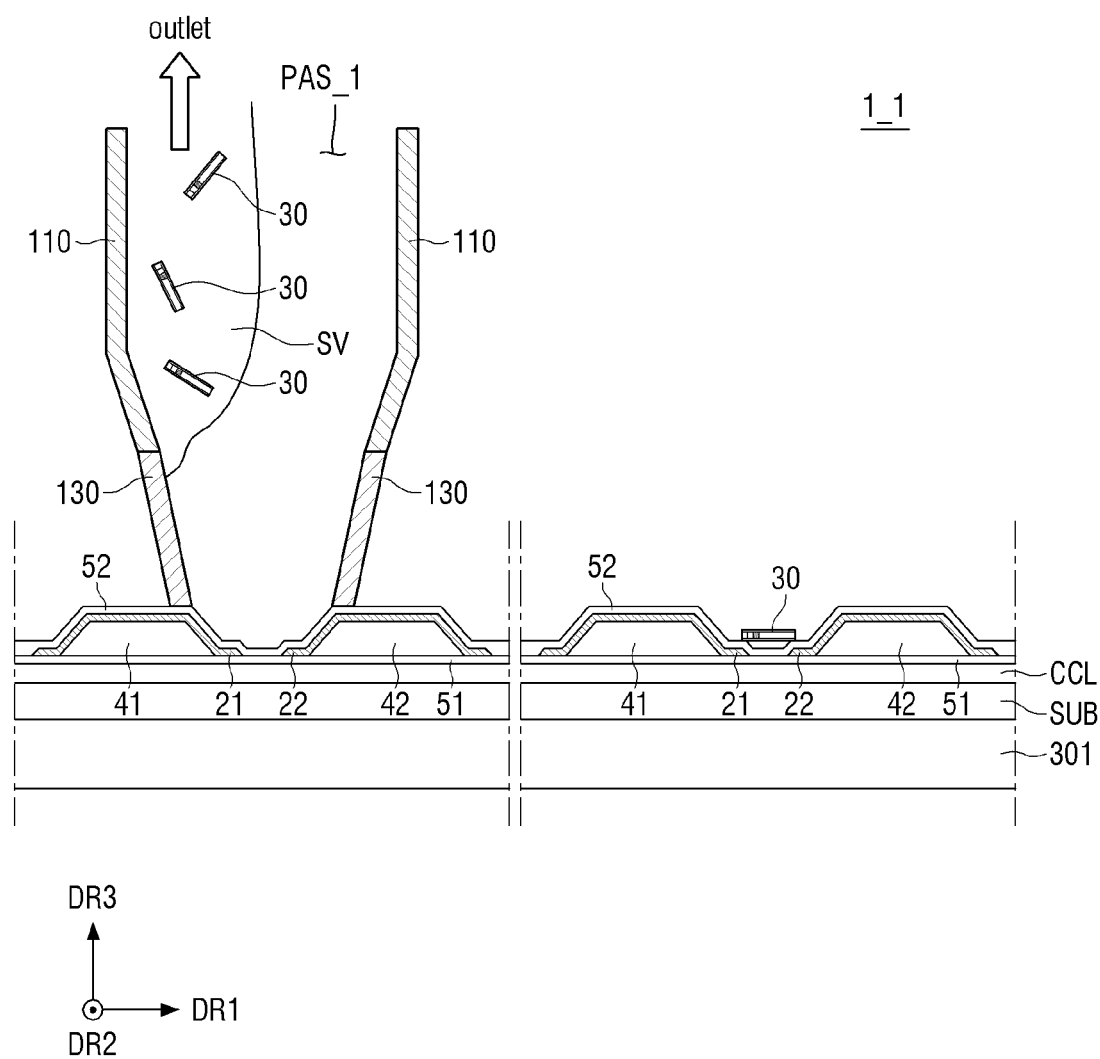

Referring to FIG. 27, the process (e.g., the bipolar element removal process) may include discharging the solvent SV in which the free light-emitting elements 30 are suspended through the solvent channel PAS_1. Thereafter, a further application process for spraying the light-emitting elements 30 may be performed on the defective area Q2 of the display module DM, such that the light-emitting elements 30 disposed in the defective area Q2 of the display module DM may be aligned with each other in the same manner in which the light-emitting elements 30 disposed in the normal area Q1 as shown in FIG. 4 are aligned with each other.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. An apparatus for removing a bipolar element for a display module, the apparatus comprising:
   a remover that removes the bipolar element; and
   a solvent storage that supplies solvent to the remover,
   wherein the remover comprises:
      a partition wall defining a solvent channel which the solvent is injected into and discharged from; and
      a vibrator disposed inside the solvent channel.

2. The apparatus of claim 1, wherein a width of the solvent channel decreases as a distance from the display module decreases.

3. The apparatus of claim 2, wherein the partition wall and the vibrator are spaced apart from each other.

4. The apparatus of claim 3, wherein a length of the partition wall is greater than a length of the vibrator.

5. The apparatus of claim 4, wherein the remover moves and is spaced apart from the display module.

6. The apparatus of claim 1, wherein
   the partition wall comprises:
      a first partition wall adjacent to the solvent storage; and
      a second partition wall adjacent to the display module, and the second partition wall has a lower rigidity than rigidity of the first partition wall.

7. The apparatus of claim 6, wherein the first partition wall and the second partition wall comprise different materials from each other.

8. The apparatus of claim 6, wherein an end of the vibrator do not overlap an end of the second partition wall in a direction perpendicular to a length direction of each of the vibrator and the second partition wall.

9. The apparatus of claim 8, wherein the solvent is received in a vibration space defined between the end of the vibrator and the second partition wall.

10. The apparatus of claim 9, wherein the solvent is adjacent to the bipolar element, and is in contact with the vibrator.

11. The apparatus of claim 10, wherein the vibrator is an ultrasonic vibrator, and vibrates the solvent received in the vibration space.

12. The apparatus of claim 11, wherein the apparatus collects the solvent into the solvent storage via the solvent channel.

13. The apparatus of claim 12, wherein the solvent is made of a liquid substance.

14. The apparatus of claim 6, wherein the display module comprises:
   a plurality of bank patterns disposed on a substrate and spaced apart from each other; and
   an insulating layer covering the plurality of bank patterns, and
   the second partition wall is in direct contact with the insulating layer.

15. An apparatus for removing a bipolar element for a display module, the apparatus comprising:
- a vibrator vibrating the display module, the display module being seated on the vibrator;
- a remover spaced apart from the vibrator, the display module being interposed between the remover and the vibrator; and
- a solvent storage that supplies solvent to the remover,
- wherein the remover comprises a partition wall defining a solvent channel which the solvent is injected into and discharged from.

16. The apparatus of claim 15, wherein the remover moves and is spaced apart from the display module.

17. The apparatus of claim 15, wherein
the partition wall comprises:
- a first partition wall adjacent to the solvent storage; and
- a second partition wall adjacent to the display module, and the second partition wall has a lower rigidity than a rigidity of the first partition wall.

18. The apparatus of claim 17, wherein the display module comprises:
- a plurality of bank patterns disposed on a substrate and spaced apart from each other; and
- an insulating layer covering the plurality of bank patterns, and
- the second partition wall is in direct contact with the insulating layer.

19. The apparatus of claim 18, wherein
the solvent is received in a vibration space adjacent to the second partition wall, and
the vibrator is an ultrasonic vibrator, and vibrates the solvent received in the vibration space.

20. The apparatus of claim 18, wherein the vibrator covers an entire area of the substrate.

* * * * *